US012620950B2

(12) United States Patent
Imai et al.

(10) Patent No.: US 12,620,950 B2
(45) Date of Patent: May 5, 2026

(54) POWER AMPLIFIER CIRCUIT

(71) Applicant: Murata Manufacturing Co., Ltd., Kyoto (JP)

(72) Inventors: Shohei Imai, Kyoto (JP); Satoshi Tanaka, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 450 days.

(21) Appl. No.: 18/307,089

(22) Filed: Apr. 26, 2023

(65) Prior Publication Data

US 2023/0261622 A1    Aug. 17, 2023

Related U.S. Application Data

(63) Continuation of application No. PCT/JP2021/039036, filed on Oct. 22, 2021.

(30) Foreign Application Priority Data

Oct. 27, 2020    (JP) .................................. 2020-179858

(51) Int. Cl.
 H03F 3/24      (2006.01)
 H03F 1/56      (2006.01)
(52) U.S. Cl.
 CPC .............. H03F 3/245 (2013.01); H03F 1/56 (2013.01); H03F 2200/09 (2013.01)
(58) Field of Classification Search
 CPC .......... H03F 1/0288; H03F 1/42; H03F 3/245; H03F 2200/222; H03F 2200/36; H03F 2200/387; H03F 2200/451

(Continued)

(56) References Cited

U.S. PATENT DOCUMENTS 6,111,465 A * 8/2000 Kakuta ................. H03F 3/3098
                                                              330/276
7,999,613 B2 * 8/2011 Burns ....................... H03F 3/24
                                                              330/124 R (Continued)

FOREIGN PATENT DOCUMENTS

JP        H10-116732 A      5/1998
JP        2006-157900 A     6/2006

(Continued)

OTHER PUBLICATIONS

Steve Maas, Applied Microwave & Wireless, vol. 11, No. 11, Nov. 1999. (Year: 1999).*

(Continued)

*Primary Examiner* — Hafizur Rahman
(74) *Attorney, Agent, or Firm* — McDonald Hopkins LLC

(57)        ABSTRACT

A power amplifier circuit includes: a power splitter; a first amplifier; a second amplifier; a first balun that splits a first amplified signal into a third amplified signal and a fourth amplified signal having a different phase from the third amplified signal; a third amplifier and a fourth amplifier that respectively amplify the third amplified signal and the fourth amplified signal; a second balun that splits a second amplified signal into a fifth amplified signal and a sixth amplified signal having a different phase from the fifth amplified signal; a fifth amplifier that amplifies the fifth amplified signal if a power level of the fifth amplified signal is equal to or higher than a predetermined power level; and a sixth amplifier that amplifies the sixth amplified signal if a power level of the sixth amplified signal is equal to or higher than a predetermined power level.

9 Claims, 16 Drawing Sheets

(58) Field of Classification Search
USPC ........................................................ 330/295
See application file for complete search history.

(56) References Cited

U.S. PATENT DOCUMENTS

| 10,305,533 B2 * | 5/2019 | Mizokami | H03F 3/189 |
|---|---|---|---|
| 2006/0097783 A1 * | 5/2006 | Okubo | H03F 1/0288 |
| | | | 330/124 R |
| 2007/0205827 A1 * | 9/2007 | Mobbs | H03F 3/602 |
| | | | 330/124 R |
| 2013/0099864 A1 * | 4/2013 | Kawai | H03F 3/245 |
| | | | 330/276 |
| 2013/0154731 A1 * | 6/2013 | Gajadharsing | H03F 1/0294 |
| | | | 330/124 R |
| 2016/0020733 A1 * | 1/2016 | Kaehs | H03F 3/245 |
| | | | 330/262 |
| 2018/0241352 A1 * | 8/2018 | Wang | H03F 3/213 |
| 2023/0299729 A1 * | 9/2023 | Chen | H03F 3/213 |
| 2023/0327615 A1 * | 10/2023 | Chen | H03F 1/56 |
| 2023/0361724 A1 * | 11/2023 | Chen | H03F 3/45179 |
| 2024/0106396 A1 * | 3/2024 | Beikmirza | H03F 3/3001 |

FOREIGN PATENT DOCUMENTS

| JP | 2007-529937 A | | 10/2007 | | |
|---|---|---|---|---|---|
| JP | 2009-153193 A | | 7/2009 | | |
| JP | 2013085179 A | * | 5/2013 | | |
| JP | 2017046145 A | * | 3/2017 | | |
| KR | 102119357 B1 | * | 6/2020 | | H03F 3/605 |
| KR | 20200067455 A | * | 6/2020 | | H01P 5/12 |

OTHER PUBLICATIONS

Anaren, Tuning Doherty Combiners, Application Note, 2020 (Year: 2020).*

Jon Shumaker, "High Power GaAs FET Amplifiers: Push-Pull versus Balanced Configurations" Feb. 12-16, 2001 • San Jose, California (Year: 2001).*

International Search Report for PCT/JP2021/039036 dated Nov. 22, 2021.

* cited by examiner

POWER AMPLIFIER CIRCUIT

CROSS REFERENCE TO RELATED APPLICATION

This is a continuation of International Application No. PCT/JP2021/039036 filed on Oct. 22, 2021 which claims priority from Japanese Patent Application No. 2020-179858 filed on Oct. 27, 2020. The contents of these applications are incorporated herein by reference in their entireties.

BACKGROUND ART

Technical Field

The present disclosure relates to a power amplifier circuit.

The Doherty amplifier is a highly efficient power amplifier. In the Doherty amplifier, in general, a carrier amplifier that operates regardless of the power level of an input signal and a peak amplifier that is turned off if the power level of the input signal is low and is turned on if the power level of the input signal is high are connected in parallel. If the power level of the input signal is high, the carrier amplifier operates while maintaining saturation at the saturation output power level. That is, in a back-off state in which only the carrier amplifier performs an amplification operation, since only the carrier amplifier operates, the peak amplifier does not consume an unnecessary current and the efficiency is increased. In a differential Doherty amplifier in which Doherty amplifiers are combined, if signals (for example, noise or the like) having the same amplitude and the same phase are simultaneously input to the respective two amplification elements, the signals having the same amplitude and the same phase can be cancelled. Accordingly, it is possible to suppress generation of noise and harmonic waves of an input signal in the power amplifier circuit (for example, see Patent Document 1).

Patent Document 1: Japanese Unexamined Patent Application Publication No. 2009-153193

BRIEF SUMMARY

A power combining power amplifier circuit described in Patent Document 1 has a configuration in which a first push-pull amplifier and a second push-pull amplifier having the same configuration are connected in parallel. A power splitter splits an input signal input from an input terminal to a path provided with the first push-pull amplifier and a path provided with a phase shifter and the second push-pull amplifier. The first push-pull amplifier amplifies the input signal by a class-B operation. On the other hand, the second push-pull amplifier amplifies the input signal by a class-C operation. A combiner receives the output power of the first push-pull amplifier and the output power of the second push-pull amplifier through a first isolator and a second isolator, respectively, and combines these output powers.

The first push-pull amplifier is provided with a first balun that splits the input signal supplied from the power splitter to a path provided with a first class-B operation transistor and a path provided with a second class-B operation transistor. The second push-pull amplifier is also provided with a balun substantially the same as the first balun.

In many cases, the balun implements conversion from a balanced signal to an unbalanced signal or vice versa by, for example, arranging two lines close to each other and electromagnetically coupling the lines. In order to implement a balun having good characteristics, it is common to make the two lines closer to each other.

However, if a line-to-line distance is about the minimum processing accuracy of a manufacturing apparatus, variations in characteristics such as the input impedance of the balun are likely to be significant due to manufacturing errors in the line-to-line distance. For example, if the input impedance of the balun varies significantly during mass production, the possibility that a reflected wave of the input signal is generated in the balun increases.

Isolation characteristics for suppressing the passage of the reflected wave in an output terminal of the power splitter to another terminal and reflection to the input terminal are not ideal in the power splitter. As a result, if the balun is directly connected to the output of the power splitter as in the power combining power amplifier circuit, a reflected wave generated in the balun in one push-pull amplifier propagates to a circuit in a preceding stage of the power splitter through the power splitter or propagates to the other push-pull amplifier. Accordingly, a power split ratio and split phase of the power splitter, and hence distortion characteristics of the circuit in the preceding stage, may be adversely affected, which is not suitable for mass production.

The present disclosure provides a power amplifier circuit suitable for mass production in a configuration in which signals split by a balun are differentially amplified.

A power amplifier circuit according to an aspect of the present disclosure includes: a power splitter that splits an input signal into a first signal and a second signal having a different phase from the first signal; a first amplifier that amplifies the first signal and outputs a first amplified signal; a second amplifier that amplifies the second signal and outputs a second amplified signal; a first balun that splits the first amplified signal into a third amplified signal and a fourth amplified signal having a different phase from the third amplified signal; a third amplifier and a fourth amplifier that respectively amplify the third amplified signal and the fourth amplified signal; a second balun that splits the second amplified signal into a fifth amplified signal and a sixth amplified signal having a different phase from the fifth amplified signal; a fifth amplifier that amplifies the fifth amplified signal if a power level of the fifth amplified signal is equal to or higher than a predetermined power level; and a sixth amplifier that amplifies the sixth amplified signal if a power level of the sixth amplified signal is equal to or higher than a predetermined power level.

According to the present disclosure, it is possible to provide a power amplifier circuit suitable for mass production in a configuration in which signals split by a balun are differentially amplified.

DETAILED DESCRIPTION

Figure 1:
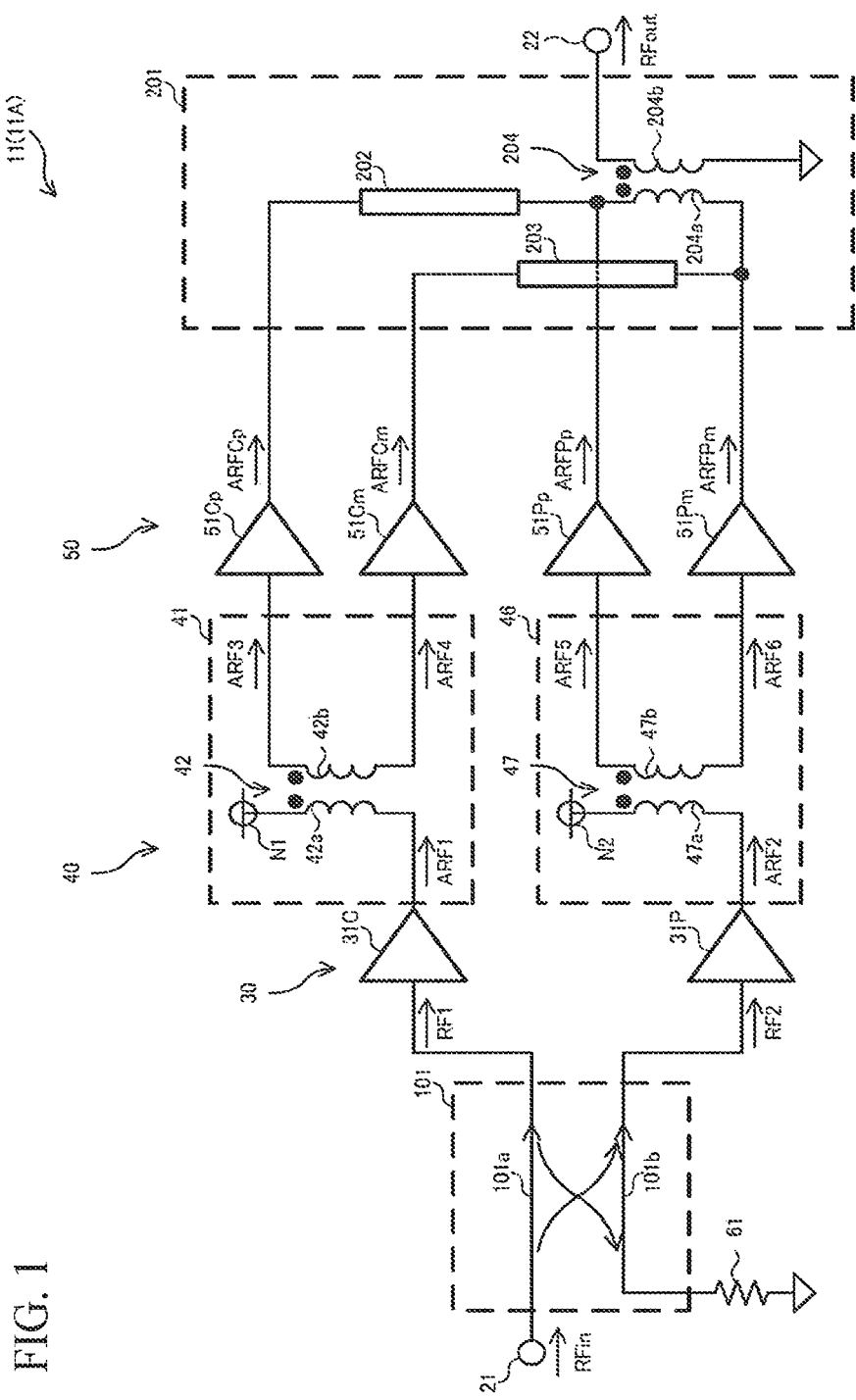
FIG. 1 is a diagram illustrating a configuration of a basic example of a power amplifier circuit according to a first embodiment of the present disclosure.

Hereinafter, embodiments of the present disclosure will be described in detail with reference to the drawings. Note that the same elements are denoted by the same reference numerals, and redundant description thereof will be omitted as much as possible.

First Embodiment

A basic example of a power amplifier circuit according to a first embodiment will be described. FIG. 1 is a diagram illustrating a configuration of the basic example of the power amplifier circuit according to the first embodiment of the present disclosure. As illustrated in FIG. 1, a basic example of a power amplifier circuit 11 according to the first embodiment (hereinafter, may be referred to as a power amplifier circuit 11A) is a circuit that amplifies an input signal (radio frequency signal) RFin and outputs an output signal (amplified signal) RFout.

The power amplifier circuit 11A includes a 90-degree hybrid coupler 101 (power splitter), a driver-stage amplifier circuit 30, a balun circuit 40, a power-stage amplifier circuit 50, a resistor 61, and a power combiner 201. The driver-stage amplifier circuit 30 is connected between the 90-degree hybrid coupler 101 and the balun circuit 40. The power-stage amplifier circuit 50 is connected between the balun circuit 40 and the power combiner 201. The elements constituting the power amplifier circuit 11A are formed on a single semiconductor substrate. Note that the elements constituting the power amplifier circuit 11A may be formed on a plurality of semiconductor substrates.

The driver-stage amplifier circuit 30 includes driver-stage amplifiers 31C (first amplifier) and 31P (second amplifier). In the following description, the driver-stage amplifier circuit 30 is assumed to be a single-stage amplification element for convenience. However, the driver-stage amplifier circuit 30 may be an amplifier circuit in which amplification elements are arranged in multiple stages. The balun circuit 40 includes a carrier-side balun 41 (first balun) and a peak-side balun 46 (second balun). The power-stage amplifier circuit 50 includes carrier-amplifiers 51Cp (third amplifier) and 51Cm (fourth amplifier) and peak-amplifiers 51Pp (fifth amplifier) and 51Pm (sixth amplifier). Hereinafter, each of the driver-stage amplifiers 31C and 31P may be referred to as a driver-stage amplifier 31.

In this embodiment, the driver-stage amplifier 31, the carrier-amplifiers 51Cp and 51Cm, and the peak-amplifiers 51Pp and 51Pm are constituted by, for example, bipolar transistors such as heterojunction bipolar transistors (HBTs). Note that the driver-stage amplifier 31, the carrier-amplifiers 51Cp and 51Cm, and the peak-amplifiers 51Pp and 51Pm may be constituted by FETs (Field Effect Transistors).

An outline of the power amplifier circuit 11A will be described. The input signal RFin is supplied to an input terminal 21. The 90-degree hybrid coupler 101 splits the input signal RFin supplied through the input terminal 21 into a signal RF1 (first signal) and a signal RF2 (second signal) having a different phase from the signal RF1.

In the driver-stage amplifier circuit 30, the driver-stage amplifier 31C amplifies the signal RF1 and outputs an amplified signal ARF1 (first amplified signal). The driver-stage amplifier 31P amplifies the signal RF2 and outputs an amplified signal ARF2 (second amplified signal).

In the balun circuit 40, the carrier-side balun 41 splits the amplified signal ARF1 into an amplified signal ARF3 (third amplified signal) and an amplified signal ARF4 (fourth amplified signal) having a different phase from the amplified signal ARF3. The peak-side balun 46 splits the amplified signal ARF2 into an amplified signal ARF5 (fifth amplified signal) and an amplified signal ARF6 (sixth amplified signal) having a different phase from the amplified signal ARF5.

In the power-stage amplifier circuit 50, the carrier amplifier 51Cp amplifies the amplified signal ARF3 and outputs an amplified signal ARFCp. The carrier amplifier 51Cm amplifies the amplified signal ARF4 and outputs an amplified signal ARFCm. The peak amplifier 51Pp amplifies the amplified signal ARF5 and outputs an amplified signal ARFPp. The peak amplifier 51Pm amplifies the amplified signal ARF6 and outputs an amplified signal ARFPm.

The power combiner 201 combines the amplified signals ARFCp, ARFCm, ARFPp, and ARFPm, and outputs the output signal RFout, which is an amplified signal of the input signal RFin, to an output terminal 22.

Hereinafter, details of the power amplifier circuit 11A will be described. In this embodiment, the 90-degree hybrid coupler 101 splits the input signal RFin into the signal RF1 and the signal RF2 delayed in phase by approximately 90 degrees with respect to the signal RF1. Note that the meaning of "delayed by approximately 90 degrees" for the power splitter of the present disclosure includes an adjustment range of plus or minus 45 degrees with respect to 90 degrees.

Specifically, the 90-degree hybrid coupler 101 includes, for example, a transmission line 101*a* and a transmission line 101*b*. The transmission lines 101*a* and 101*b* are, for example, strip lines or microstrip lines provided on a semiconductor substrate, and are lines represented by a distributed constant circuit. For example, the transmission lines 101*a* and 101*b* are formed so as to extend together in a certain direction in plan view of the semiconductor substrate on which the power amplifier circuit 11A is formed.

The 90-degree hybrid coupler 101 has a first end connected to the input terminal 21 and supplied with the input signal RFin, a second end connected to the driver-stage amplifier 31C and supplying the signal RF1, a third end grounded through the resistor 61, and a fourth end connected to the driver-stage amplifier 31P and supplying the signal RF2.

The transmission line 101*a* in the 90-degree hybrid coupler 101 has a first end connected to the input terminal 21 through the first end of the 90-degree hybrid coupler 101, and a second end connected to the driver-stage amplifier 31C through the second end of the 90-degree hybrid coupler 101.

The transmission line 101*b* has a first end grounded through the third end of the 90-degree hybrid coupler 101 and the resistor 61, and a second end connected to the driver-stage amplifier 31P through the fourth end of the 90-degree hybrid coupler 101.

The resistor 61 connected to the third end of the 90-degree hybrid coupler 101 attenuates the reflected wave from the carrier-side balun 41 or the peak-side balun 46. Accordingly, it is possible to suppress the reflected wave from being further reflected by the 90-degree hybrid coupler 101 and supplied to the driver-stage amplifier circuit 30.

The driver-stage amplifier 31C in the driver-stage amplifier circuit 30 is connected to the second end of the 90-degree hybrid coupler 101, and has an input terminal to which the signal RF1 is input, and an output terminal from which the amplified signal ARF1 is output. Note that the driver-stage amplifier 31C includes a matching circuit (not illustrated) that matches the impedance between the 90-degree hybrid coupler 101 and the driver-stage amplifier 31C.

The driver-stage amplifier 31P is connected to the fourth end of the 90-degree hybrid coupler 101 and has an input terminal to which the signal RF2 is input, and an output terminal from which the amplified signal ARF2 is output.

Note that the driver-stage amplifier 31P includes a matching circuit (not illustrated) that matches the impedance between the 90-degree hybrid coupler 101 and the driver-stage amplifier 31P.

The carrier-side balun 41 in the balun circuit 40 converts the amplified signal ARF1, which is an unbalanced signal, into the amplified signals ARF3 and ARF4, which are balanced signals. Here, the amplified signal ARF4 is, for example, delayed in phase by approximately 180 degrees with respect to the amplified signal ARF3 (the phases are inverted). Note that the meaning of "delayed by approximately 180 degrees" in the balun circuit 40 of the present disclosure includes an adjustment range of plus or minus 90 degrees with respect to 180 degrees. That is, the delay of the amplified signal ARF4 in phase with respect to the amplified signal ARF3 is 90 degrees or more and 270 degrees or less.

The carrier-side balun 41 also matches the impedance between the driver-stage amplifier 31C and the carrier amplifiers 51Cp and 51Cm.

More specifically, the carrier-side balun 41 includes a transformer 42 including a primary-side winding 42*a* and a secondary-side winding 42*b*. The primary-side winding 42*a* has a first end connected to a power source voltage supplying node N1 of the driver-stage amplifier 31C, and a second end connected to the output terminal of the driver-stage amplifier 31C and supplied with the amplified signal ARF1. The secondary-side winding 42*b* is electromagnetically coupled to the primary-side winding 42*a* and has a first end connected to the carrier amplifier 51Cp to supply the amplified signal ARF3, and a second end connected to the carrier amplifier 51Cm to supply the amplified signal ARF4.

The peak-side balun 46 converts the amplified signal ARF2, which is an unbalanced signal, into the amplified signals ARF5 and ARF6, which are balanced signals. Here, the amplified signal ARF6 is, for example, delayed in phase by approximately 180 degrees with respect to the amplified signal ARF5 (the phases are inverted).

The peak-side balun 46 also matches the impedance between the driver-stage amplifier 31P and the peak amplifiers 51Pp and 51Pm.

More specifically, the peak-side balun 46 includes a transformer 47 including a primary-side winding 47*a* and a secondary-side winding 47*b*. The primary-side winding 47*a* has a first end connected to a power source voltage supplying node N2 of the driver-stage amplifier 31P, and a second end connected to the output terminal of the driver-stage amplifier 31P and supplied with the amplified signal ARF2. The secondary-side winding 47*b* is electromagnetically coupled to the primary-side winding 47*a* and has a first end connected to the peak amplifier 51Pp to supply the amplified signal ARF5, and a second end connected to the peak amplifier 51Pm to supply the amplified signal ARF6.

In the power-stage amplifier circuit 50, the carrier amplifiers 51Cp and 51Cm constitute a differential pair of an output stage (power stage) on the carrier side. The carrier amplifiers 51Cp and 51Cm are biased, for example, to class A, class AB, or class B. That is, the carrier amplifiers 51Cp and 51Cm amplify an input signal and output an amplified signal regardless of the power level of the input signal such as a small instantaneous input power.

More specifically, the carrier amplifier 51Cp has an input terminal connected to the first end of the secondary-side winding 42*b* in the carrier-side balun 41 and to which the amplified signal ARF3 is input, an output terminal from which the amplified signal ARFCp is output.

The carrier amplifier 51Cm has an input terminal connected to the second end of the secondary-side winding 42*b* in the carrier-side balun 41 and to which the amplified signal ARF4 is input, and an output terminal from which the amplified signal ARFCm is output.

The peak amplifiers 51Pp and 51Pm constitute a differential pair of an output stage (power stage) on the peak side. The peak amplifiers 51Pp and 51Pm are biased to, for example, class C.

More specifically, the peak amplifier 51Pp has an input terminal connected to the first end of the secondary-side winding 47*b* in the peak-side balun 46 and to which the amplified signal ARF5 is input, and an output terminal that amplifies the amplified signal ARF5 and outputs the amplified signal ARFPp if the power level of the amplified signal ARF5 is equal to or higher than a predetermined power level.

The peak amplifier 51Pm has an input terminal connected to the second end of the secondary-side winding 47b in the peak-side balun 46 and to which the amplified signal ARF6 is input, and an output terminal that amplifies the amplified signal ARF6 and outputs the amplified signal ARFPm if the power level of the amplified signal ARF6 is equal to or higher than a predetermined power level.

As described above, in the power amplifier circuit 11A, the two carrier amplifiers 51Cp and 51Cm, which respectively amplify the amplified signals ARF3 and ARF4 having a phase difference of approximately 180 degrees, form a differential amplifier circuit. In addition, the two peak amplifiers 51Pp and 51Pm, which respectively amplify the amplified signals ARF5 and ARF6 having a phase difference of approximately 180 degrees, form a differential amplifier circuit. The differential amplifier circuit includes a pair of two amplification elements, and amplifies and outputs a potential difference between signals having the same amplitude and opposite phases input to the two amplification elements. Therefore, if signals (for example, noise or the like) having the same amplitude and the same phase are simultaneously input to the respective two amplification elements, the signals having the same amplitude and the same phase are cancelled. Accordingly, it is possible to suppress generation of noise and harmonic waves of an input signal in the power amplifier circuit 11A.

If the power-stage amplifier circuit 50 performs an amplification operation, a large current flows through an emitter (or source) terminal. In a configuration in which a single-ended signal is amplified, the current flows to the ground of the substrate. However, since the ground of the substrate has an inductance, the potential of the ground may fluctuate. The fluctuation of the ground potential on the carrier side and the fluctuation of the ground potential on the peak side may interfere with each other to generate unnecessary frequency characteristics or to oscillate in the worst case. With the differential configuration as in the power-stage amplifier circuit 50, alternating current components of emitter current of the differential pair can cancel each other. Accordingly, it is possible to reduce the fluctuation of the ground potential, and to reduce the mutual interference with another circuit having a single-end configuration (for example, the driver-stage amplifier circuit 30 or the power splitter) in the circuit.

In the power amplifier circuit 11A, for example, the carrier amplifier 51Cp and the peak amplifier 51Pp form a Doherty amplifier circuit, and the carrier amplifier 51Cm and the peak amplifier 51Pm form a Doherty amplifier circuit. As a result, regardless of the power level of the input signal RFin, the carrier amplifier 51Cp performs an amplification operation in a region where the power level is equal to or higher than zero. In addition, the peak amplifier 51Pp performs an amplification operation in a region where the voltage level of the input signal RFin is equal to or higher than a level (predetermined power level) lower than a maximum level Vmax by a predetermined level. That is, by combining the operations of the two amplifiers in accordance with the power level of the input signal, the region in which the carrier amplifier 51Cp operates at the saturation power is widened. As a result, the power efficiency of the power amplifier circuit 11A is improved. The carrier amplifier 51Cm and the peak amplifier 51Pm operate in the same manner.

The power combiner 201 includes ¼-wavelength lines 202 and 203 and a transformer 204. The transformer 204 includes a primary-side winding 204a and a secondary-side winding 204b.

The ¼-wavelength line 202 has a first end connected to the output terminal of the carrier amplifier 51Cp, and a second end. For example, the phase of the amplified signal ARFCp supplied from the carrier amplifier 51Cp is delayed by approximately 90 degrees through the ¼-wavelength line 202. Note that the meaning of "delayed by approximately 90 degrees" in the power combiner 201 of the present disclosure includes an adjustment range of plus or minus 45 degrees with respect to 90 degrees.

The ¼-wavelength line 203 has a first end connected to the output terminal of the carrier amplifier 51Cm, and a second end. For example, the phase of the amplified signal ARFCm supplied from the carrier amplifier 51Cm is delayed by approximately 90 degrees through the ¼-wavelength line 203.

The primary-side winding 204a in the transformer 204 has a first end connected to the second end of the ¼-wavelength line 202 and the output terminal of the peak amplifier 51Pp, and a second end connected to the second end of the ¼-wavelength line 203 and the output terminal of the peak amplifier 51Pm. The secondary-side winding 204b is electromagnetically coupled to the primary-side winding 204a, and has a first end connected to the output terminal 22, and a second end that is grounded.

Since the phase of the amplified signal ARFCp is delayed by approximately 90 degrees through the ¼-wavelength line 202, the amplified signal ARFCp and the amplified signal ARFPp are combined at the first end of the primary-side winding 204a in a state where the phases are approximately aligned.

Since the phase of the amplified signal ARFCm is delayed by approximately 90 degrees through the ¼-wavelength line 203, the amplified signal ARFCm and the amplified signal ARFPm are combined at the second end of the primary-side winding 204a in a state where the phases are approximately aligned.

Since the phase difference between the amplified signal input to the first end of the primary-side winding 204a and the amplified signal input to the second end of the primary-side winding 204a is approximately 180 degrees, a voltage having an amplitude approximately twice as large as the amplified signal input to the first end of the primary-side winding 204a is applied to the primary-side winding 204a. Based on this voltage, the output signal RFout is generated at the first end of the secondary-side winding 204b electromagnetically coupled to the primary-side winding 204a, and electric power is combined.

(First Modification Example of Power Amplifier Circuit 11)

A first modification example of the power amplifier circuit 11 illustrated in FIG. 1 will be described. In the description of modification examples, descriptions of matters common to those in the basic example will be omitted, and only different points will be described. In particular, substantially the same functions and effects obtained by substantially the same configurations will not be sequentially described for each modification example.

Figure 2:
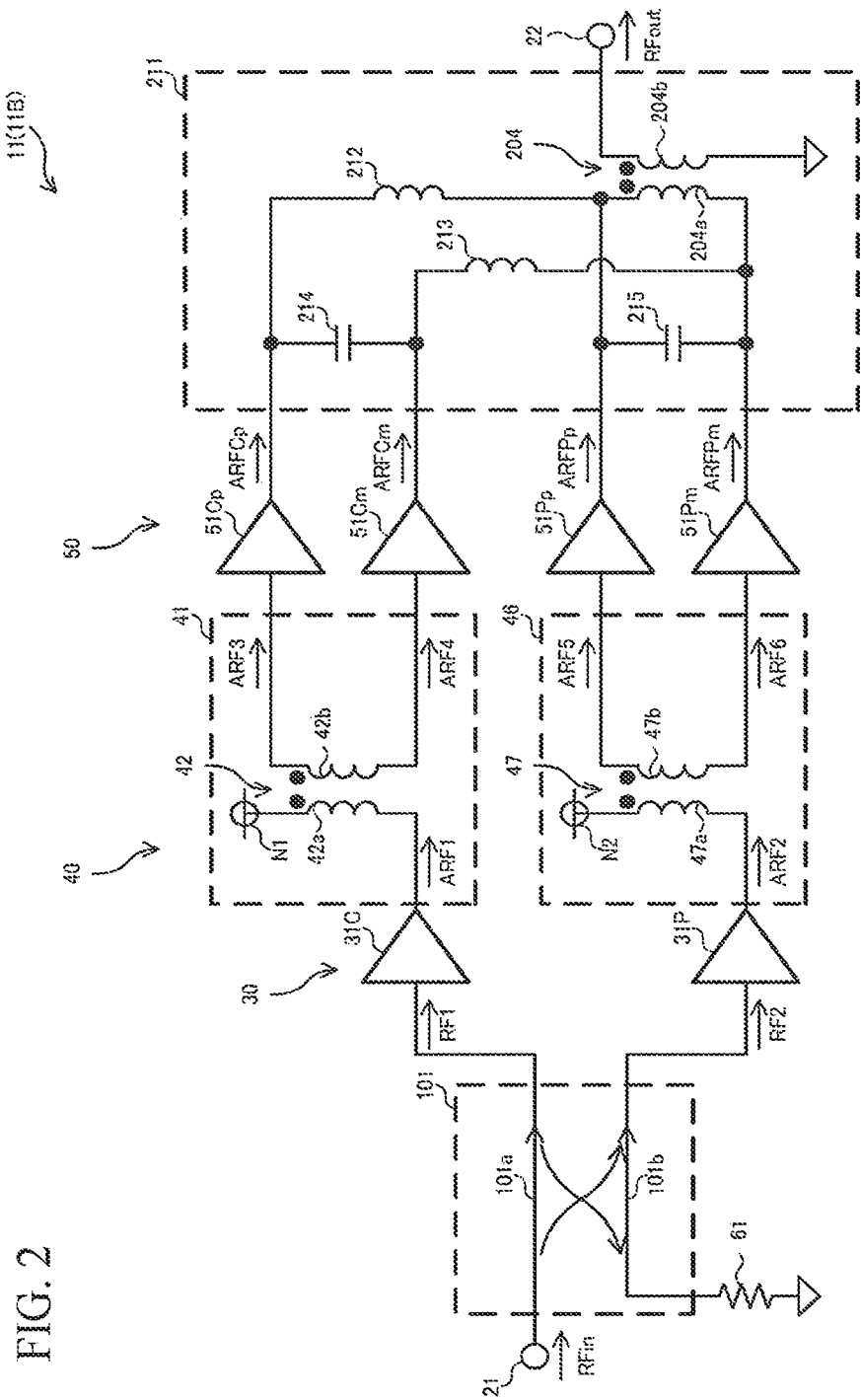
FIG. 2 is a circuit diagram illustrating a first modification example of the power amplifier circuit according to the first embodiment of the present disclosure.

FIG. 2 is a circuit diagram illustrating the first modification example of the power amplifier circuit according to the first embodiment of the present disclosure. As illustrated in FIG. 2, the first modification example of the power amplifier circuit 11 (hereinafter, may be referred to as a power amplifier circuit 11B) is different from the power amplifier circuit 11A illustrated in FIG. 1 in that the power combiner is constituted by a π-type equivalent circuit of the ¼-wavelength lines 202 and 203.

In this modification example, compared with the power amplifier circuit 11A illustrated in FIG. 1, the power amplifier circuit 11B includes a power combiner 211 instead of the power combiner 201.

The power combiner 211 includes inductors 212 and 213, capacitors 214 and 215, and the transformer 204.

The capacitor 214 has a first end connected to the output terminal of the carrier amplifier 51Cp, and a second end connected to the output terminal of the carrier amplifier 51Cm. The capacitor 215 has a first end connected to the output terminal of the peak amplifier 51Pp, and a second end connected to the output terminal of the peak amplifier 51Pm.

The inductor 212 has a first end connected to the output terminal of the carrier amplifier 51Cp, and a second end connected to the output terminal of the peak amplifier 51Pp and the first end of the primary-side winding 204a in the transformer 204.

The inductor 213 has a first end connected to the output terminal of the carrier amplifier 51Cm, and a second end connected to the output terminal of the peak amplifier 51Pm and the second end of the primary-side winding 204a in the transformer 204.

By the inductors 212 and 213 and the capacitors 214 and 215, for example, the phase of the amplified signal ARFCp supplied from the carrier amplifier 51Cp and the phase of the amplified signal ARFCm supplied from the carrier amplifier 51Cm are delayed by approximately 90 degrees, respectively.

As described above, the ¼-wavelength lines 202 and 203 (see FIG. 1) are replaced with the inductors 212 and 213 and the capacitors 214 and 215, and the power combiner 211 is constituted by a lumped constant circuit. Accordingly, it is possible to reduce the circuit size of the power combiner 211.

(Second Modification Example of Power Amplifier Circuit 11)

Figure 3:
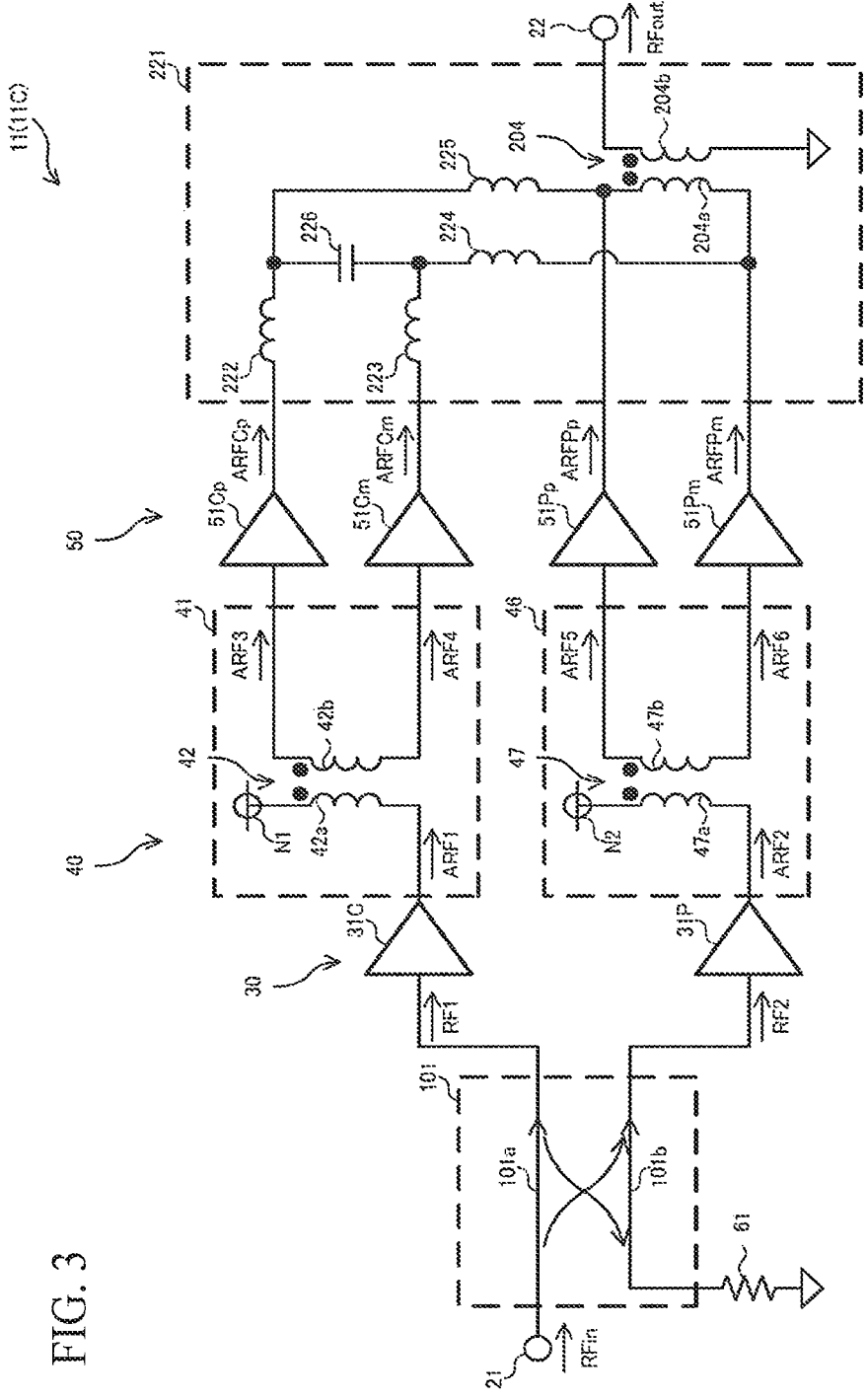
FIG. 3 is a circuit diagram illustrating a second modification example of the power amplifier circuit according to the first embodiment of the present disclosure.

A second modification example of the power amplifier circuit 11 illustrated in FIG. 1 will be described. FIG. 3 is a circuit diagram illustrating the second modification example of the power amplifier circuit according to the first embodiment of the present disclosure. As illustrated in FIG. 3, the second modification example of the power amplifier circuit 11 (hereinafter, may be referred to as a power amplifier circuit 11C) is different from the power amplifier circuit 11A illustrated in FIG. 1 in that the power combiner is constituted by a T-type equivalent circuit of the ¼-wavelength lines 202 and 203.

In this modification example, compared with the power amplifier circuit 11A illustrated in FIG. 1, the power amplifier circuit 11C includes a power combiner 221 instead of the power combiner 201.

The power combiner 221 includes inductors 222, 223, 224, and 225, a capacitor 226, and the transformer 204.

The inductor 222 has a first end connected to the output terminal of the carrier amplifier 51Cp, and a second end. The inductor 223 has a first end connected to the output terminal of the carrier amplifier 51Cm, and a second end. The capacitor 226 has a first end connected to the second end of the inductor 222, and a second end connected to the second end of the inductor 223.

The inductor 225 has a first end connected to the second end of the inductor 222 and the first end of the capacitor 226, and a second end connected to the output terminal of the peak amplifier 51Pp and the first end of the primary-side winding 204a in the transformer 204.

The inductor 224 has a first end connected to the second end of the inductor 223 and the second end of the capacitor 226, and a second end connected to the output terminal of the peak amplifier 51Pm and the second end of the primary-side winding 204a in the transformer 204.

By the inductors 222, 223, 224, and 225 and the capacitor 226, for example, the phase of the amplified signal ARFCp supplied from the carrier amplifier 51Cp and the phase of the amplified signal ARFCm supplied from the carrier amplifier 51Cm are delayed by approximately 90 degrees, respectively.

As described above, the ¼-wavelength lines 202 and 203 (see FIG. 1) are replaced with the inductors 222, 223, 224, and 225 and the capacitor 226, and the power combiner 221 is constituted by a lumped constant circuit.

Accordingly, it is possible to reduce the circuit size of the power combiner 221. Although not illustrated, the power combiner 221 may be constituted separately in the inside of a semiconductor chip and in or on a module substrate, or may be constituted in the inside of a semiconductor chip or on a module substrate. For example, the capacitor 226 may be disposed in the layout of the primary-side winding 204a and the secondary-side winding 204b.

(Third Modification Example of Power Amplifier Circuit 11)

Figure 4:
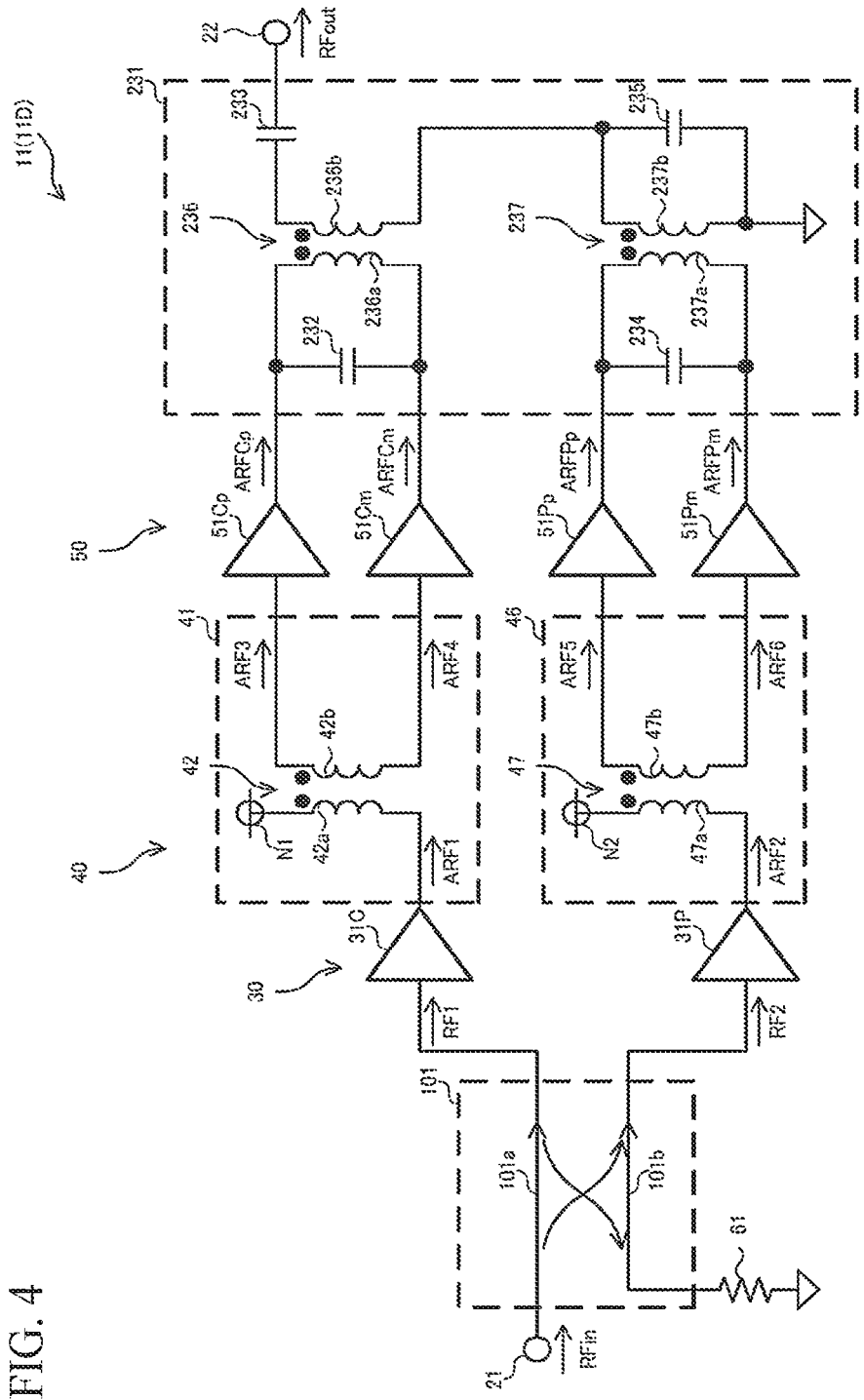
FIG. 4 is a circuit diagram illustrating a third modification example of the power amplifier circuit according to the first embodiment of the present disclosure.

A third modification example of the power amplifier circuit 11 illustrated in FIG. 1 will be described. FIG. 4 is a circuit diagram illustrating the third modification example of the power amplifier circuit according to the first embodiment of the present disclosure. As illustrated in FIG. 4, the third modification example of the power amplifier circuit 11 (hereinafter, may be referred to as a power amplifier circuit 11D) is different from the power amplifier circuit 11A illustrated in FIG. 1 in that the power combiner is constituted by two transformers connected in series.

In this modification example, compared with the power amplifier circuit 11A illustrated in FIG. 1, the power amplifier circuit 11D includes a power combiner 231 instead of the power combiner 201.

The power combiner 231 includes capacitors 232, 233, 234, and 235 and transformers 236 and 237. The transformer 236 includes a primary-side winding 236a and a secondary-side winding 236b. The transformer 237 includes a primary-side winding 237a and a secondary-side winding 237b.

The capacitor 232 has a first end connected to the output terminal of the carrier amplifier 51Cp, and a second end connected to the output terminal of the carrier amplifier 51Cm.

The primary-side winding 236a in the transformer 236 has a first end connected to the output terminal of the carrier amplifier 51Cp, and a second end connected to the output terminal of the carrier amplifier 51Cm. The secondary-side winding 236b is electromagnetically coupled to the primary-side winding 236a and has a first end and a second end.

The capacitor 233 has a first end connected to the first end of the secondary-side winding 236b, and a second end connected to the output terminal 22.

The capacitor 234 has a first end connected to the output terminal of the peak amplifier 51Pp, and a second end connected to the output terminal of the peak amplifier 51Pm.

The primary-side winding 237a in the transformer 237 has a first end connected to the output terminal of the peak amplifier 51Pp, and a second end connected to the output terminal of the peak amplifier 51Pm.

The secondary-side winding 237b is electromagnetically coupled to the primary-side winding 237a and has a first end connected to the second end of the secondary-side winding 236b in the transformer 236, and a second end that is grounded.

The capacitor 235 has a first end connected to the first end of the secondary-side winding 237*b* in the transformer 237, and a second end connected to the second end of the secondary-side winding 237*b*.

(Fourth Modification Example of Power Amplifier Circuit 11)

Figure 5:
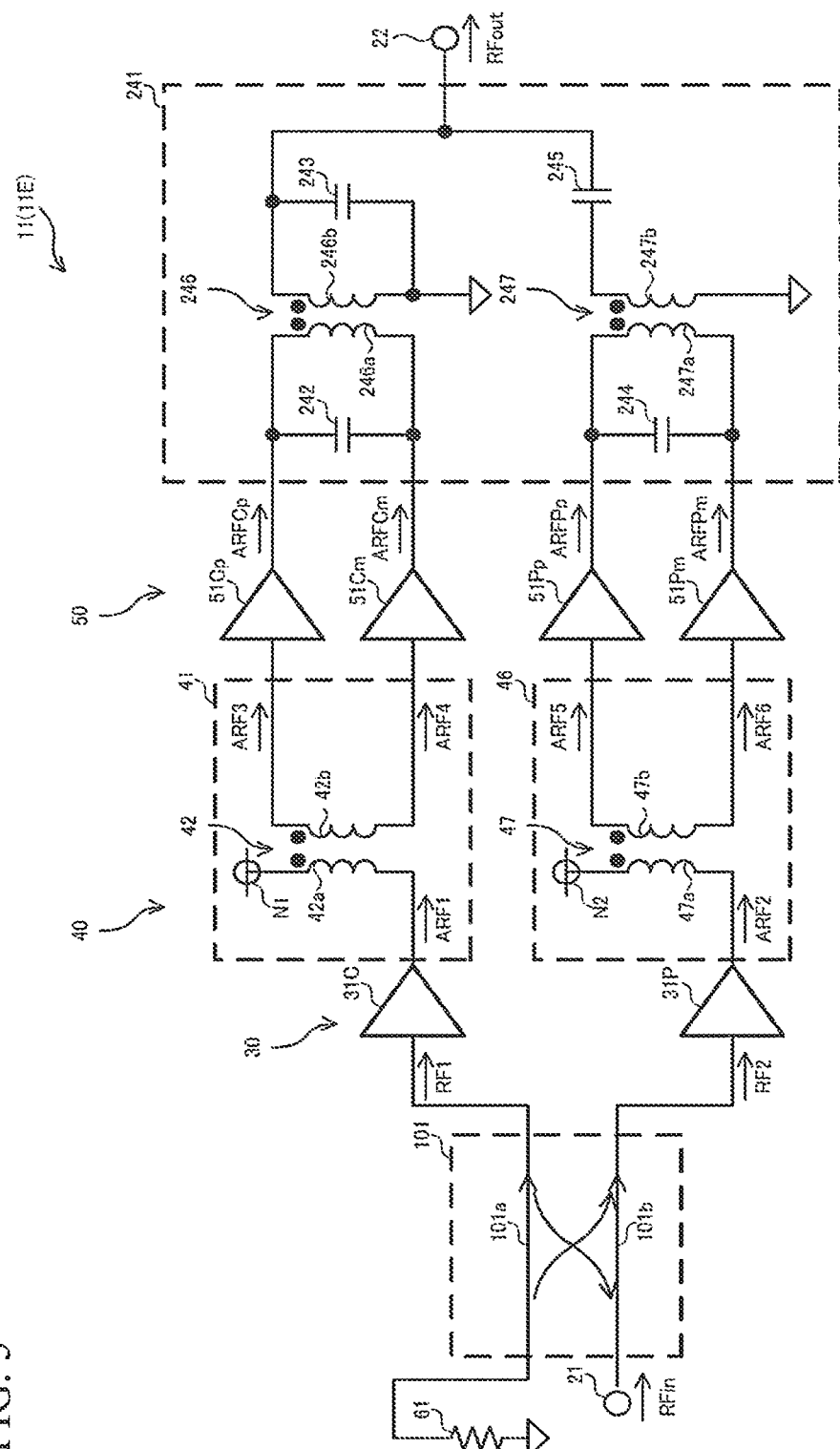
FIG. 5 is a circuit diagram illustrating a fourth modification example of the power amplifier circuit according to the first embodiment of the present disclosure.

A fourth modification example of the power amplifier circuit 11 illustrated in FIG. 1 will be described. FIG. 5 is a circuit diagram illustrating the fourth modification example of the power amplifier circuit according to the first embodiment of the present disclosure. As illustrated in FIG. 5, the fourth modification example of the power amplifier circuit 11 (hereinafter, may be referred to as a power amplifier circuit 11E) is different from the power amplifier circuit 11A illustrated in FIG. 1 in that the power combiner is constituted by two transformers connected in parallel.

In this modification example, compared with the power amplifier circuit 11A illustrated in FIG. 1, the power amplifier circuit 11E includes a power combiner 241 instead of the power combiner 201. The first end of the 90-degree hybrid coupler 101 is grounded through the resistor 61. The third end of the 90-degree hybrid coupler 101 is connected to the input terminal 21.

The power combiner 241 includes capacitors 242, 243, 244, and 245 and transformers 246 and 247. The transformer 246 includes a primary-side winding 246*a* and a secondary-side winding 246*b*. The transformer 247 includes a primary-side winding 247*a* and a secondary-side winding 247*b*.

The capacitor 242 has a first end connected to the output terminal of the carrier amplifier 51Cp, and a second end connected to the output terminal of the carrier amplifier 51Cm.

The primary-side winding 246*a* in the transformer 246 has a first end connected to the output terminal of the carrier amplifier 51Cp, and a second end connected to the output terminal of the carrier amplifier 51Cm. The secondary-side winding 246*b* is electromagnetically coupled to the primary-side winding 246*a*, and has a first end connected to the output terminal 22, and a second end that is grounded.

The capacitor 243 has a first end connected to the first end of the secondary-side winding 246*b*, and a second end connected to the second end of the secondary-side winding 246*b*. The capacitor 245 has a first end connected to the output terminal 22, and a second end.

The capacitor 242 has a first end connected to the output terminal of the peak amplifier 51Pp, and a second end connected to the output terminal of the peak amplifier 51Pm.

The primary-side winding 247*a* in the transformer 247 has a first end connected to the output terminal of the peak amplifier 51Pp, and a second end connected to the output terminal of the peak amplifier 51Pm.

The secondary-side winding 247*b* is electromagnetically coupled to the primary-side winding 247*a*, and has a first end connected to the second end of the capacitor 245, and a second end that is grounded.

Functions and Effects

In order to quantitatively estimate the effects of the power amplifier circuit 11, the inventor has simulated a change in the performance of the power amplifier circuit 11 in a case where the input impedance of the carrier-side balun 41 or the peak-side balun 46 (hereinafter, referred to as a balun input impedance) varies.

The inventor has set variations in the balun input impedance in the simulation. Specifically, for example, the size, the arrangement, and the like of the carrier-side balun 41 and the peak-side balun 46 vary among individual products, and thus, the balun input impedance also varies among individual products. In this simulation, a balun input impedance Zb is set to have an error of $Zb=(\alpha+j\beta)\times Zave$.

Here, Zave is an average value of the balun input impedance at the time of mass production, $\alpha$ is a real number that varies in a function of errors based on a mean $\alpha ave=1$ and a standard deviation $\sigma\alpha=0.2$, $\beta$ is a real number that varies in a function of errors based on a mean $\beta ave=0$ and a standard deviation $\sigma\beta=0.2$, and j is an imaginary unit.

Figure 6:
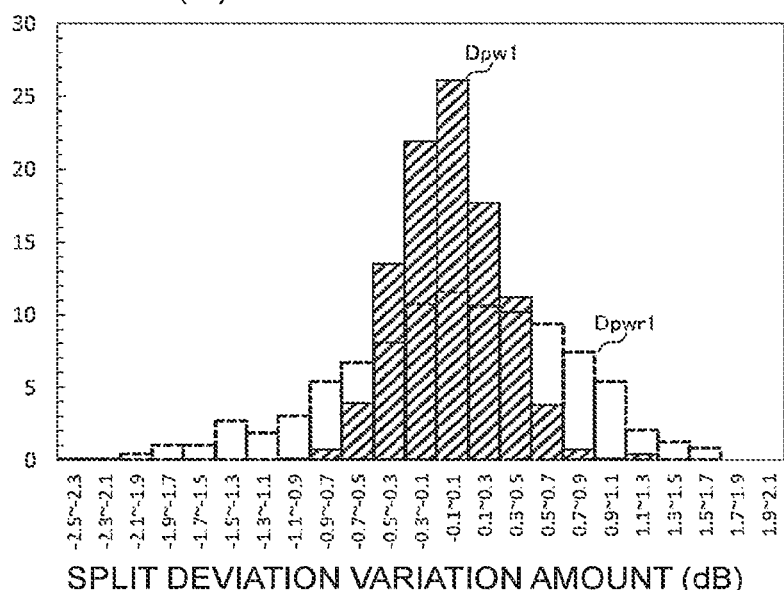
FIG. 6 is a graph illustrating an example of a distribution of a split deviation variation amount in a power amplifier circuit according to the first embodiment of the present disclosure.

FIG. 6 is a graph illustrating an example of a distribution of a split deviation variation amount in the power amplifier circuit 11. In FIG. 6, the horizontal axis represents the split deviation variation amount in the unit of "dB", and the vertical axis represents the occurrence probability in the unit of "%".

Figure 7:
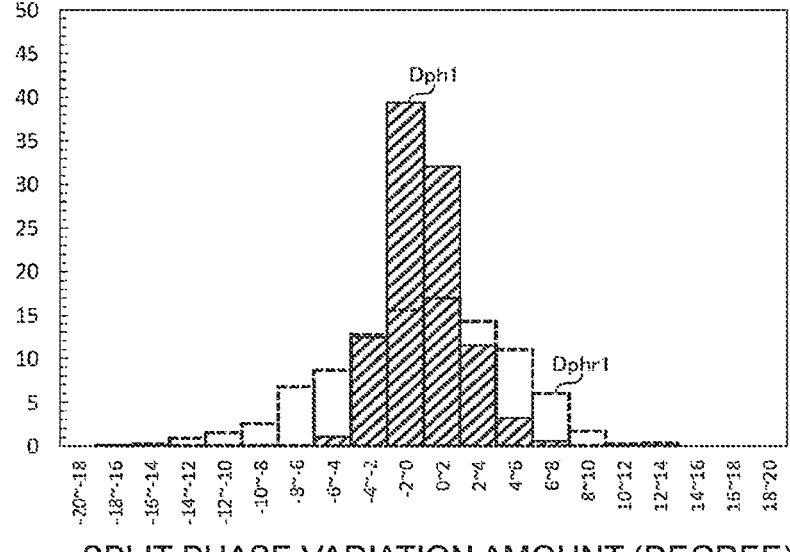
FIG. 7 is a graph illustrating an example of a distribution of a split phase variation amount in the power amplifier circuit according to the first embodiment of the present disclosure.

FIG. 7 is a graph illustrating an example of a distribution of a split phase variation amount in the power amplifier circuit 11. In FIG. 7, the horizontal axis represents the split phase variation amount in the unit of "degree", and the vertical axis represents the occurrence probability in the unit of "%".

As illustrated in FIGS. 6 and 7, the inventor has calculated a distribution Dpw1 of the split deviation variation amount and a distribution Dph1 of the split phase variation amount of the 90-degree hybrid coupler 101 in the power amplifier circuit 11. In the power amplifier circuit 11, a balun having a statistical property of the balun input impedance Zb is used as the carrier-side balun 41 and the peak-side balun 46.

The distribution Dpw1 is, for example, a histogram indicating, for each of classes of every 0.2-dB split deviation variation amount, the occurrence probability of the power amplifier circuit 11 having the split deviation variation amount included in the class. The distribution Dph1 is, for example, a histogram indicating, for each of classes of every 2-degree split phase variation amount, the occurrence probability of the power amplifier circuit 11 having the split phase variation amount included in the class.

The inventor has also calculated a reference distribution Dpwr1 of the split deviation variation amount and a reference distribution Dphr1 of the split phase variation amount of the 90-degree hybrid coupler 101 in a configuration in which, unlike the power amplifier circuit 11, the driver-stage amplifier circuit 30 is not provided between the 90-degree hybrid coupler 101 and the balun circuit 40 (hereinafter, may be referred to as a first reference configuration). In the first reference configuration, a balun having a statistical property of the balun input impedance Zb is used as the carrier-side balun 41 and the peak-side balun 46.

The reference distribution Dpwr1 is, for example, a histogram indicating, for each of classes of every 0.2-dB split deviation variation amount, the occurrence probability of the first reference configuration having the split deviation variation amount included in the class. The reference distribution Dphr1 is, for example, a histogram indicating, for each of classes of every 2-degree split phase variation amount, the occurrence probability of the first reference configuration having the split phase variation amount included in the class.

Note that 1000 samples have been used for the calculation of the distributions Dpw1 and Dph1 and the reference distributions Dpwr1 and Dphr1.

Here, the split deviation variation amount indicates, for example, how much the power splitting from the 90-degree hybrid coupler 101 to the driver-stage amplifiers 31C and 31P varies from a power splitting criterion. The power splitting criterion is, for example, the power splitting from the 90-degree hybrid coupler 101 to the driver-stage amplifiers 31C and 31P when the power amplifier circuit 11 operates as designed. When the power amplifier circuit 11 operates as designed, the split deviation variation amount is zero, and reflected waves from the carrier-side balun 41 and the peak-side balun 46 are sufficiently suppressed.

The split phase variation amount indicates, for example, how much the phase of signal RF1 from the 90-degree hybrid coupler 101 to the driver-stage amplifier 31C or the signal RF2 from the 90-degree hybrid coupler 101 to the driver-stage amplifier 31P varies from a criterion phase. The criterion phase is, for example, the phase of the signal RF1 or the phase of the signal RF2 when the power amplifier circuit 11 operates as designed. When the power amplifier circuit 11 operates as designed, the split phase variation amount is zero, and the phase of the signal RF1 and the phase of the signal RF2 are as designed.

Variations in the distribution Dpw1 of the power amplifier circuit 11 are suppressed as compared with the reference distribution Dpwr1 of the first reference configuration (see FIG. 6). Variations in the distribution Dph1 of the power amplifier circuit 11 are suppressed as compared with the reference distribution Dphr1 of the first reference configuration (see FIG. 7).

Specifically, the standard deviation of the reference distribution Dpwr1 and the standard deviation of the reference distribution Dphr1 are 0.71 dB and 4.8 degrees, respectively. In contrast, by applying the power amplifier circuit 11, the standard deviation of the distribution Dpw1 and the standard deviation of the distribution Dph1 are improved to 0.31 dB and 2.0 degrees, respectively.

That is, even if the balun input impedance Zb varies among individual products, the power amplifier circuit 11 can suppress the imbalance in power splitting from the 90-degree hybrid coupler 101 to the carrier side and the peak side. In addition, even if the balun input impedance Zb varies among individual products, the power amplifier circuit 11 can suppress the deviation of the phase of the signal RF1 and the phase of the signal RF2 from design values. Accordingly, it is possible to suppress variations in the performance of the power amplifier circuit 11 among individual products and provide the power amplifier circuit 11 with stable performance.

Second Embodiment

A power amplifier circuit according to a second embodiment will be described. In the second and subsequent embodiments, descriptions of matters common to those in the first embodiment will be omitted, and only different points will be described. In particular, substantially the same functions and effects obtained by substantially the same configurations will not be sequentially described for each embodiment.

Figure 8:
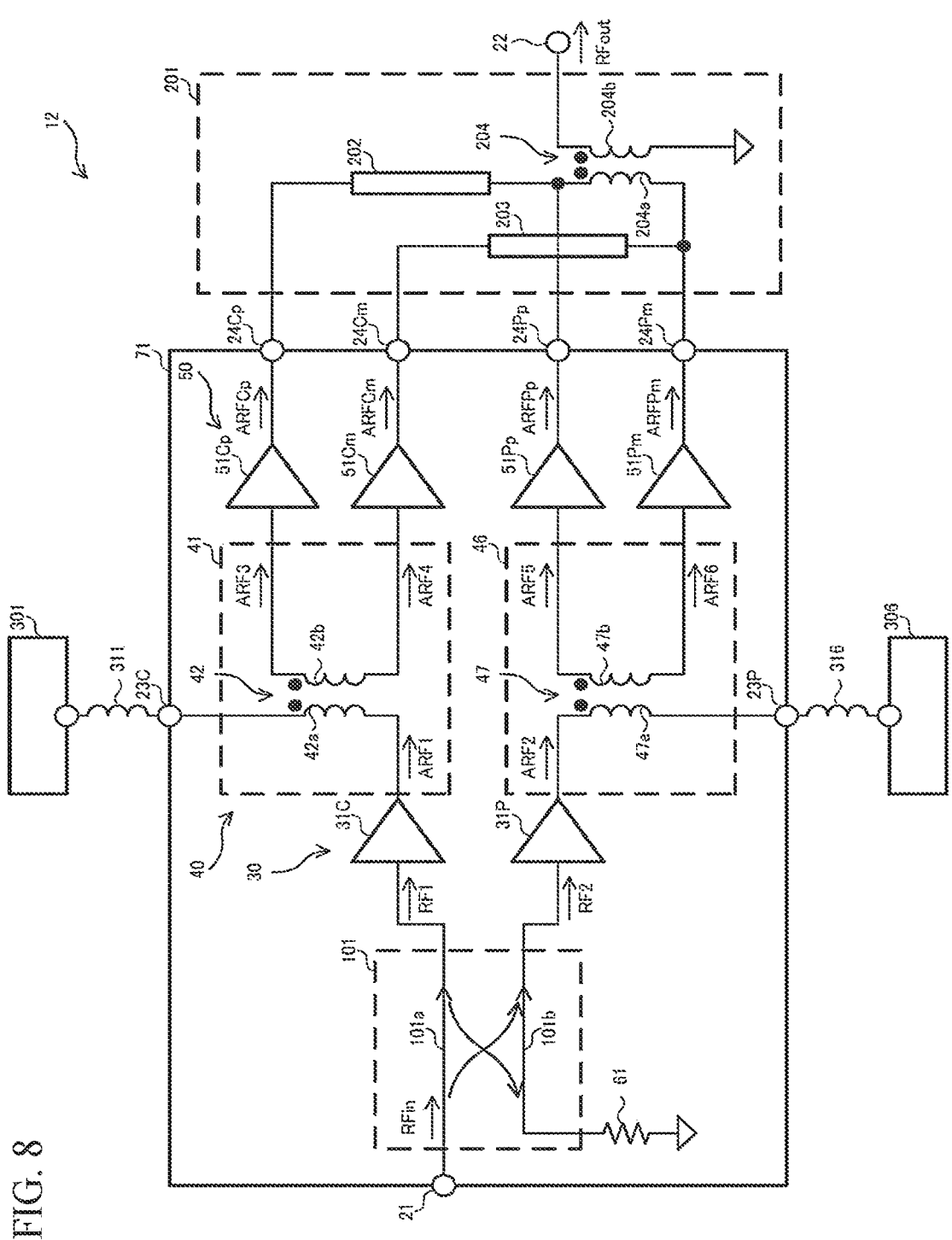
FIG. 8 is a circuit diagram illustrating a power amplifier circuit according to a second embodiment of the present disclosure.

FIG. 8 is a circuit diagram illustrating the power amplifier circuit according to the second embodiment of the present disclosure. As illustrated in FIG. 8, a power amplifier circuit 12 according to the second embodiment is different from the power amplifier circuit 11 according to the first embodiment in that the power amplifier circuit 12 is connected to an external circuit.

The power amplifier circuit 12 has a circuit configuration substantially the same as that of the power amplifier circuit 11A illustrated in FIG. 1. In this embodiment, the 90-degree hybrid coupler 101, the driver-stage amplifier circuit 30, the balun circuit 40, and the power-stage amplifier circuit 50 in the power amplifier circuit 12 are provided inside a semiconductor region 71. The power combiner 201 is provided outside the semiconductor region 71.

The semiconductor region 71 is, for example, a surface and the inside of a single semiconductor substrate. That is, the respective elements of the 90-degree hybrid coupler 101, the driver-stage amplifier circuit 30, the balun circuit 40, and the power-stage amplifier circuit 50 are mounted either on the surface or in the inside of the single semiconductor substrate.

The input terminal 21 and connection terminals 23C, 23P, 24Cp, 24Cm, 24Pp, and 24Pm are terminals provided inside the semiconductor region 71. The power-stage amplifier circuit 50 is connected to the power combiner 201 through connection terminals 24Cp, 24Cm, 24Pp, and 24Pm.

The carrier-side balun 41 includes, for example, a terminal connected to an external circuit 301 of the semiconductor substrate. In addition, the peak-side balun 46 includes, for example, a terminal connected to an external circuit 306 of the semiconductor substrate. The external circuits 301 and 306 are provided outside the semiconductor region 71 and are, for example, circuits having a power source supplying terminal, a ground terminal, or the like.

In this embodiment, when the power amplifier circuit 12 is mounted, the connection terminal 23C and the power source supplying terminal or the ground terminal in the external circuit 301 are connected through, for example, a wire or microbump. Likewise, the connection terminal 23P and the power source supplying terminal or the ground terminal in the external circuit 306 are connected through, for example, a wire or microbump. An inductor component is parasitic on the wire and the microbump.

More specifically, the first end of the primary-side winding 42a of the carrier-side balun 41 is connected to the connection terminal 23C. The connection terminal 23C is connected to the power source supplying terminal or the ground terminal in the external circuit 301 through a parasitic inductor 311 of the wire or microbump. The first end of the primary-side winding 47a of the peak-side balun 46 is connected to the connection terminal 23P. The connection terminal 23P is connected to the power source supplying terminal or the ground terminal in the external circuit 306 through a parasitic inductor 316 of the wire or microbump.

The wire and microbump are structurally larger in size than the 90-degree hybrid coupler 101, the driver-stage amplifier circuit 30, the balun circuit 40, the power-stage amplifier circuit 50, and the like, which are manufactured by a semiconductor process. For this reason, variations in the wire and microbump among individual products at the time of mounting, that is, manufacturing errors, are large in general.

Since the size of the wire and microbump varies greatly among individual products, the inductance of the parasitic inductor 311 also varies greatly among individual products.

If the first end of the primary-side winding 42a of the carrier-side balun 41 is connected to the parasitic inductor 311, the input impedance of the carrier-side balun 41 varies due to variations in the carrier-side balun 41 itself among individual products and variations in the wire or microbump among individual products.

That is, since the first end of the primary-side winding 42a is connected to the parasitic inductor 311, variations in the input impedance of the carrier-side balun 41 among individual products is further increased.

Likewise, since the first end of the primary-side winding 47a is connected to the parasitic inductor 316, variations in the input impedance of the peak-side balun 46 among individual products is further increased.

As a result, in the power amplifier circuit 12, since the variations in the input impedance of the carrier-side balun 41 and the peak-side balun 46 among individual products is large, there is a high possibility that the reflected wave by the carrier-side balun 41 and the peak-side balun 46 becomes large.

In contrast, in the power amplifier circuit 12, the reflected wave from the balun circuit 40 can be suppressed by the driver-stage amplifier circuit 30 having good isolation characteristics. Accordingly, even in an individual product of the power amplifier circuit 12 in which the balun input impedance varies greatly and the reflected wave is large, it is possible to suppress a decrease in the performance of the power amplifier circuit 12. Accordingly, even if variations in the balun input impedance among individual products increase due to the connection with the external circuit, it is possible to suppress variations in the performance of the power amplifier circuit 12 among individual products and provide the power amplifier circuit 12 with stable performance.

In the power amplifier circuit 12 according to this embodiment, the carrier-side balun 41 includes a terminal connected to the external circuit 301 of the semiconductor substrate, and the peak-side balun 46 includes a terminal connected to the external circuit 306 of the semiconductor substrate. Although such a configuration has been described, the configuration is not limited to this. One of the carrier-side balun 41 and the peak-side balun 46 may have a configuration in which a terminal connected to the external circuit 301 or the external circuit 306 is absent.

In the power amplifier circuit 12 according to this embodiment, the 90-degree hybrid coupler 101, the driver-stage amplifier circuit 30, the balun circuit 40, and the power-stage amplifier circuit 50 are provided inside the semiconductor region 71. Although such a configuration has been described, the configuration is not limited to this. Only the driver-stage amplifier circuit 30 and the balun circuit 40 may be provided inside the semiconductor region 71.

Third Embodiment

Figure 9:
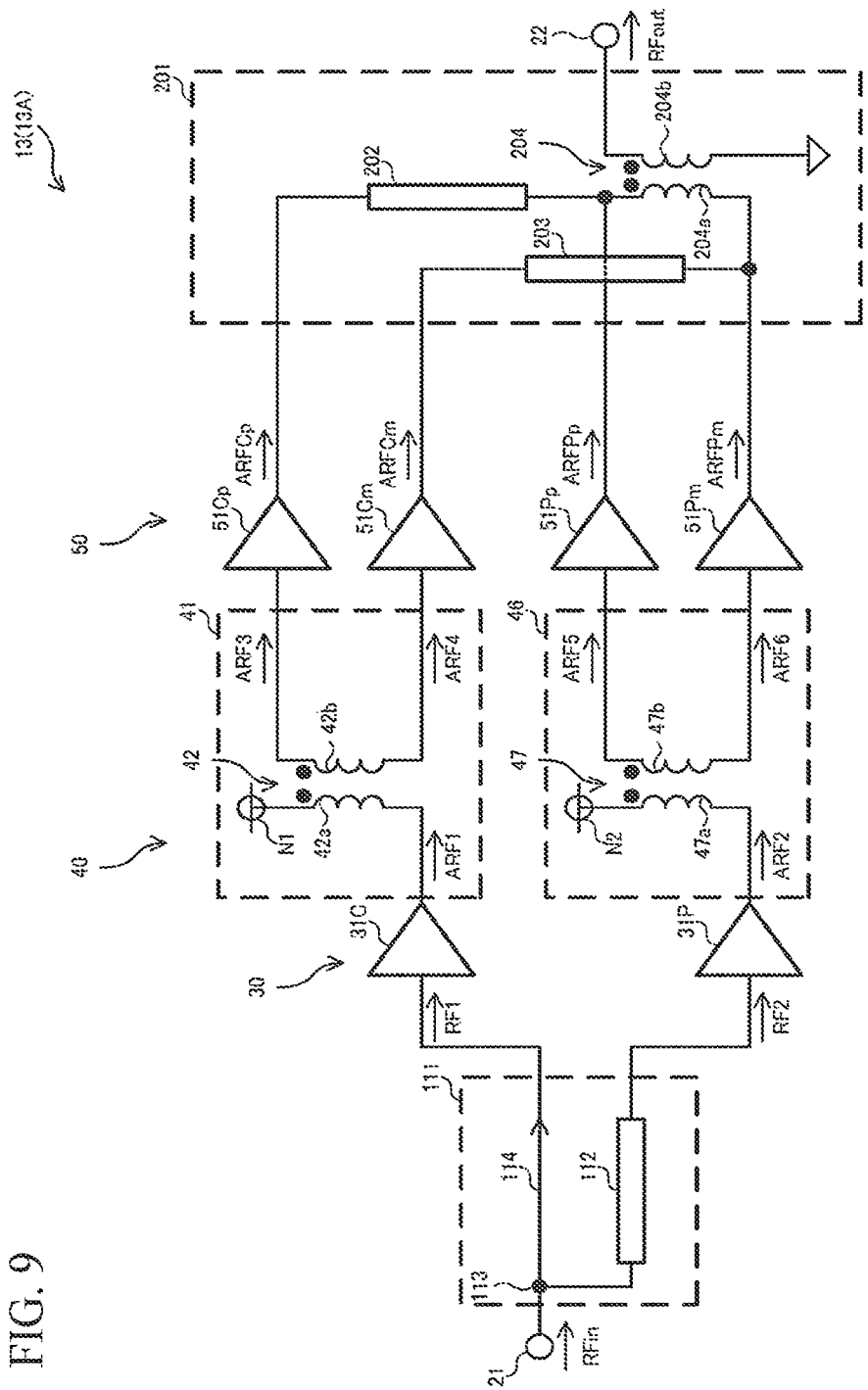
FIG. 9 is a circuit diagram illustrating a basic example of a power amplifier circuit according to a third embodiment of the present disclosure.

A power amplifier circuit according to a third embodiment will be described. FIG. 9 is a circuit diagram illustrating a basic example of the power amplifier circuit according to the third embodiment of the present disclosure. As illustrated in FIG. 9, a power amplifier circuit 13 according to the third embodiment is different from the power amplifier circuit 11 according to the first embodiment in that the power splitter is not grounded through a resistor.

In this embodiment, compared with the power amplifier circuit 11A illustrated in FIG. 1, a basic example of the power amplifier circuit 13 (hereinafter, may be referred to as a power amplifier circuit 13A) includes a power splitter 111 instead of the resistor 61 and the 90-degree hybrid couplet 101.

The power splitter 111 includes a ¼-wavelength line 112, a branching unit 113, and a transmission line 114. More specifically, the power splitter 111 has a first end connected to the input terminal 21, a second end connected to the input terminal of the driver-stage amplifier 31P, and a third end connected to the input terminal of the driver-stage amplifier 31C.

The ¼-wavelength line 112 has a first end connected to the first end of the power splitter 111 through the branching unit 113, and a second end connected to the second end of the power splitter 111. The transmission line 114 has a first end connected to the branching unit 113, and a second end connected to the third end of the power splitter 111.

The branching unit 113 branches the input signal RFin supplied through the first end of the power splitter 111 into the signal RF1 and the signal RF2. The signal RF1 is supplied to the input terminal of the driver-stage amplifier 31C through the transmission line 114.

The signal RF2 is supplied to the input terminal of the driver-stage amplifier 31P through the ¼-wavelength line 112. The signal RF2 that has passed through the ¼-wavelength line 112 is delayed in phase by approximately 90 degrees with respect to the signal RF1 that has passed through the transmission line 114.

Functions and Effects

A resistor that attenuates a reflected wave from the carrier-side balun 41 or the peak-side balun 46, such as the resistor 61 (see FIG. 1) in the power amplifier circuit 11A, is not connected to the power splitter 111. Accordingly, the configuration of the power amplifier circuit 13A can be simplified. On the other hand, the power splitter 111 does not have good isolation characteristics. As described above, even in a case where the power splitter 111 that does not have good isolation characteristics is used, the present disclosure is particularly effective by employing the configuration of the power amplifier circuit 13.

Figure 10:
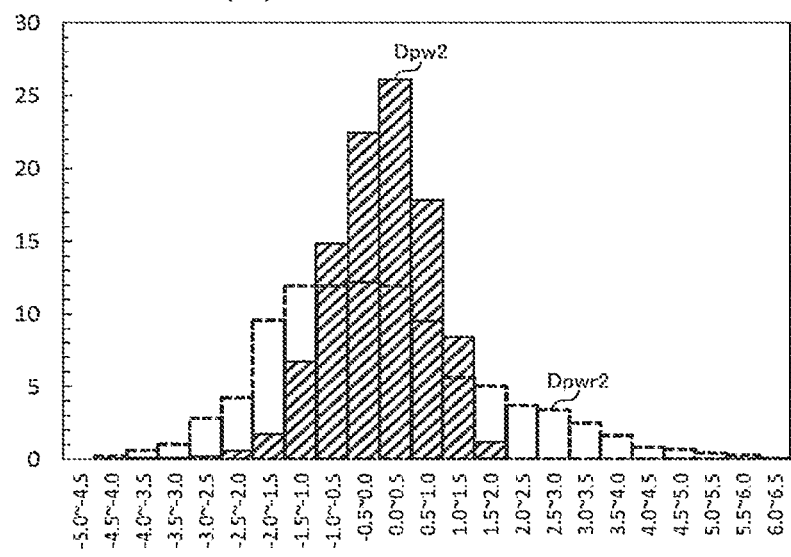
FIG. 10 is a graph illustrating an example of a distribution of a split deviation variation amount in the power amplifier circuit according to the third embodiment of the present disclosure.

FIG. 10 is a graph illustrating an example of a distribution of a split deviation variation amount in the power amplifier circuit according to the third embodiment of the present disclosure. In FIG. 10, the horizontal axis represents the split deviation variation amount in the unit of "dB", and the vertical axis represents the occurrence probability in the unit of "%".

Figure 11:
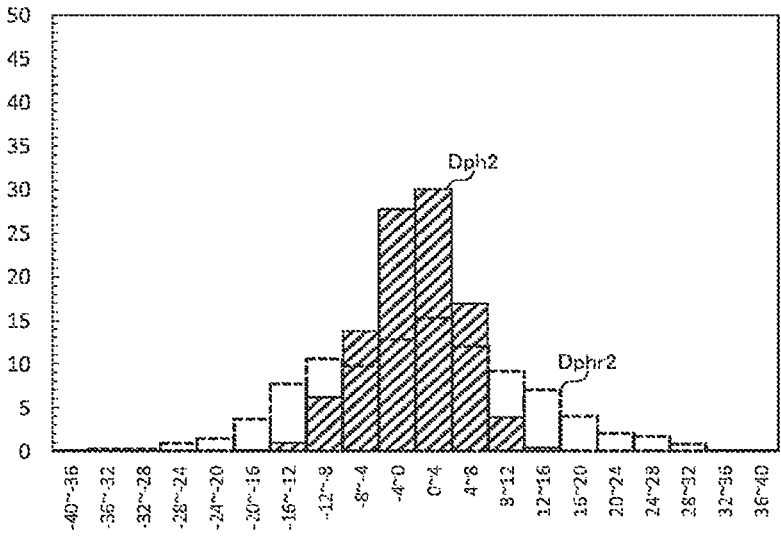
FIG. 11 is a graph illustrating an example of a distribution of a split phase variation amount in the power amplifier circuit according to the third embodiment of the present disclosure.

FIG. 11 is a graph illustrating an example of a distribution of a split phase variation amount in the power amplifier circuit according to the third embodiment of the present disclosure. In FIG. 11, the horizontal axis represents the split phase variation amount in the unit of "degree", and the vertical axis represents the occurrence probability in the unit of "%".

As illustrated in FIGS. 10 and 11, the inventor has calculated a distribution Dpw2 of the split deviation variation amount and a distribution Dph2 of the split phase variation amount of the power splitter 111 in the power amplifier circuit 13. In the power amplifier circuit 13, a balun having a statistical property of the balun input impedance Zb is used as the carrier-side balun 41 and the peak-side balun 46.

The distribution Dpw2 is, for example, a histogram indicating, for each of classes of every 0.5-dB split deviation variation amount, the occurrence probability of the power amplifier circuit 13 having the split deviation variation amount included in the class. The distribution Dph2 is, for example, a histogram indicating, for each of classes of every 4-degree split phase variation amount, the occurrence probability of the power amplifier circuit 13 having the split phase variation amount included in the class.

The inventor has also calculated a reference distribution Dpwr2 of the split deviation variation amount and a reference distribution Dphr2 of the split phase variation amount of the power splitter 111 in a configuration in which, unlike the power amplifier circuit 13, the driver-stage amplifier circuit 30 is not provided between the power splitter 111 and the balun circuit 40 (hereinafter, may be referred to as a second reference configuration). In the second reference configuration, a balun having a statistical property of the balun input impedance Zb is used as the carrier-side balun 41 and the peak-side balun 46.

The reference distribution Dpwr2 is, for example, a histogram indicating, for each of classes of every 0.5-dB split deviation variation amount, the occurrence probability of the second reference configuration having the split deviation variation amount included in the class. The reference distribution Dphr2 is, for example, a histogram indicating, for each of classes of every 4-degree split phase variation amount, the occurrence probability of the second reference configuration having the split phase variation amount included in the class.

Note that 1000 samples have been used for the calculation of the distributions Dpw2 and Dph2 and the reference distributions Dpwr2 and Dphr2.

Variations in the distribution Dpw2 of the power amplifier circuit 13 are suppressed as compared with the reference distribution Dpwr2 of the second reference configuration (see FIG. 10). Variations in the distribution Dph2 of the power amplifier circuit 13 are suppressed as compared with the reference distribution Dphr2 of the second reference configuration (see FIG. 11).

Specifically, the standard deviation of the reference distribution Dpwr2 and the standard deviation of the reference distribution Dphr2 are 1.8 dB and 11.6 degrees, respectively. In contrast, by applying the power amplifier circuit 13, the standard deviation of the distribution Dpw2 and the standard deviation of the distribution Dph2 are improved to 0.8 dB and 5.0 degrees, respectively. As described above, it is confirmed by the simulation that variations in the split deviation variation amount and the split phase variation amount at the time of mass production can be suppressed by applying the power amplifier circuit 13.

That is, even if the power splitter 111 does not have good isolation characteristics, the power amplifier circuit 13 can suppress the imbalance in power splitting from the power splitter 111 to the carrier side and the peak side. In addition, even if the power splitter 111 does not have good isolation characteristics, the power amplifier circuit 13 can suppress the deviation of the phase of the signal RF1 and the phase of the signal RF2 from design values. Accordingly, even if the power splitter 111 does not have good isolation characteristics, it is possible to suppress variations in the performance of the power amplifier circuit 13 among individual products and provide the power amplifier circuit 13 with stable performance.

(First Modification Example of Power Amplifier Circuit 13)

Figure 12:
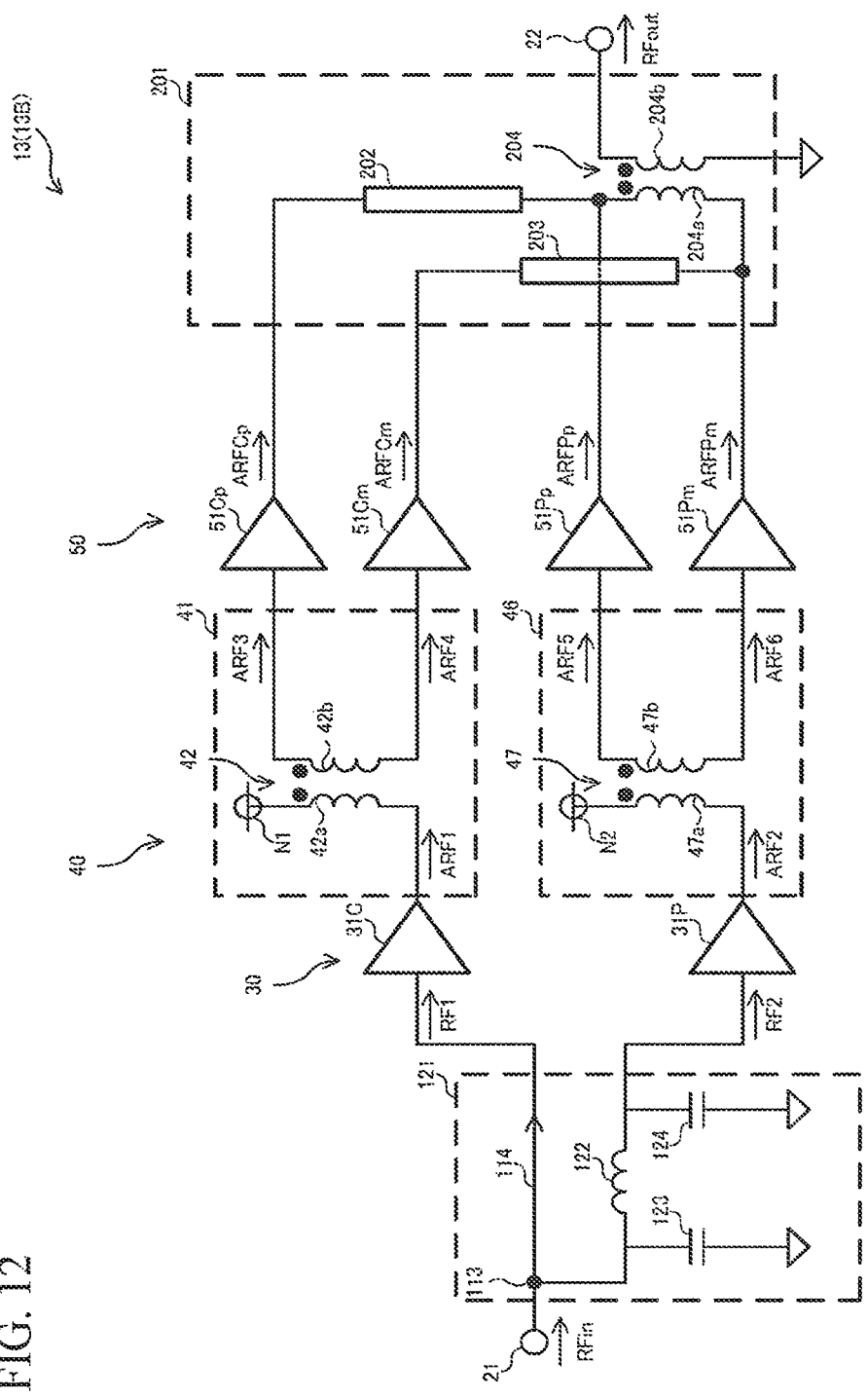
FIG. 12 is a circuit diagram illustrating a first modification example of the power amplifier circuit according to the third embodiment of the present disclosure.

A first modification example of the power amplifier circuit 13 illustrated in FIG. 9 will be described. FIG. 12 is a circuit diagram illustrating the first modification example of the power amplifier circuit according to the third embodiment of the present disclosure. As illustrated in FIG. 12, the first modification example of the power amplifier circuit 13 (hereinafter, may be referred to as a power amplifier circuit 13B) is different from the power amplifier circuit 13A illustrated in FIG. 9 in that the power splitter is constituted by a π-type equivalent circuit of the ¼-wavelength line 112.

In this modification example, compared with the power amplifier circuit 13A illustrated in FIG. 9, the power amplifier circuit 13B includes a power splitter 121 instead of the power splitter 111.

The power splitter 121 includes the branching unit 113, the transmission line 114, an inductor 122, and capacitors 123 and 124.

The inductor 122 has a first end connected to the branching unit 113, and a second end connected to the input terminal of the driver-stage amplifier 31P. The capacitor 123 has a first end connected to the first end of the inductor 122, and a second end that is grounded. The capacitor 124 has a first end connected to the second end of the inductor 122, and a second end that is grounded.

As described above, the ¼-wavelength line 112 (see FIG. 9) is replaced with the inductor 122 and the capacitors 123 and 124, and the power splitter 121 is constituted by a lumped constant circuit. Accordingly, it is possible to reduce the circuit size of the power splitter 121.

(Second Modification Example of Power Amplifier Circuit 13)

Figure 13:
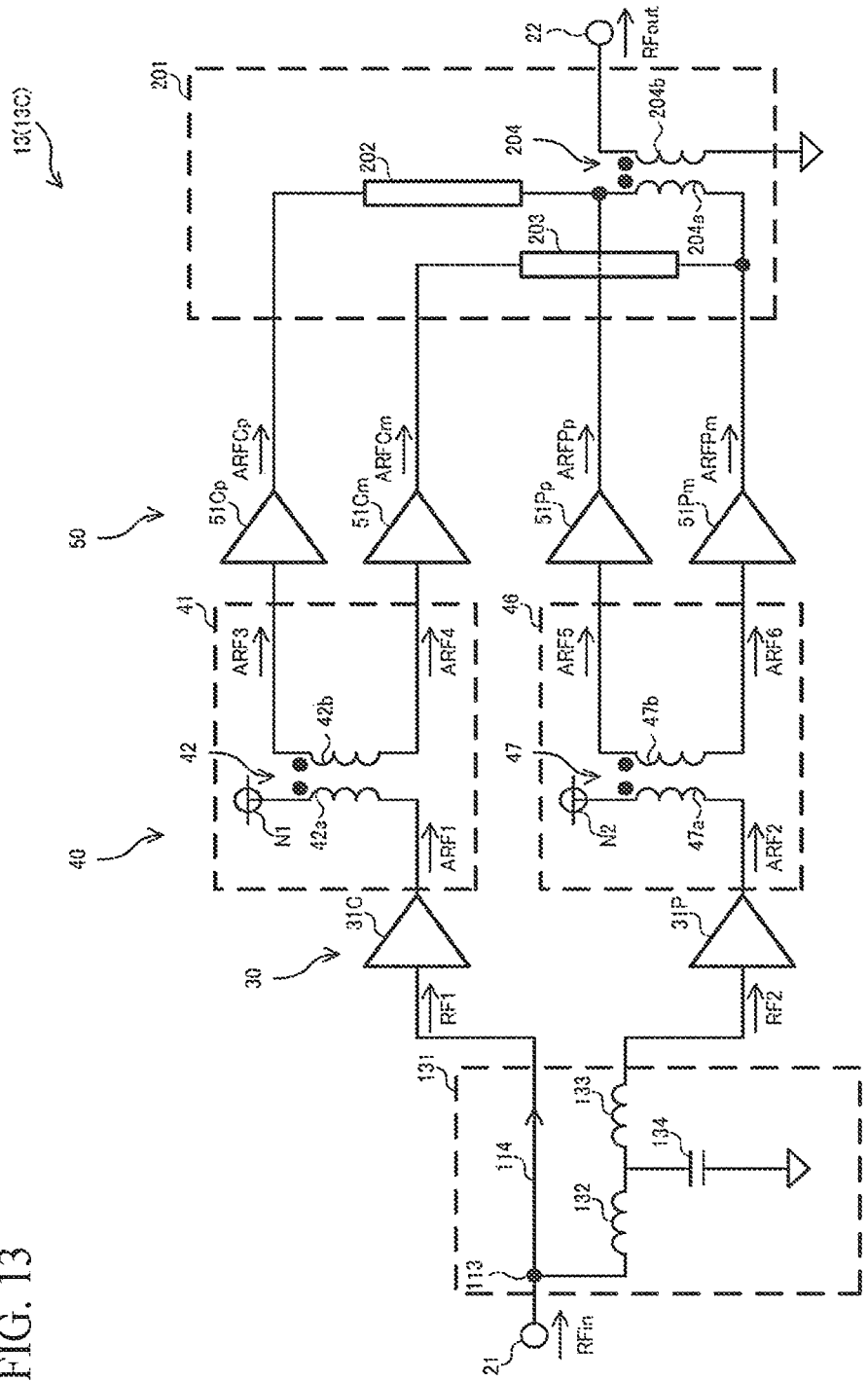
FIG. 13 is a circuit diagram illustrating a second modification example of the power amplifier circuit according to the third embodiment of the present disclosure.

FIG. 13 is a circuit diagram illustrating a second modification example of the power amplifier circuit according to the third embodiment of the present disclosure. As illustrated in FIG. 13, the second modification example of the power amplifier circuit 13 (hereinafter, may be referred to as a power amplifier circuit 13C) is different from the power amplifier circuit 13A illustrated in FIG. 9 in that the power splitter is constituted by a T-type equivalent circuit of the ¼-wavelength line 112.

In this modification example, compared with the power amplifier circuit 13A illustrated in FIG. 9, the power amplifier circuit 13C includes a power splitter 131 instead of the power splitter 111.

The power splitter 131 includes the branching unit 113, the transmission line 114, inductors 132 and 133, and a capacitor 134.

The inductor 132 has a first end connected to the branching unit 113, and a second end. The inductor 133 has a first end connected to the second end of the inductor 132, and a second end connected to the input terminal of the driver-stage amplifier 31P. The capacitor 134 has a first end connected to the second end of the inductor 132 and the first end of the inductor 133, and a second end that is grounded.

As described above, the ¼-wavelength line 112 (see FIG. 9) is replaced with the inductors 132 and 133 and the capacitor 134, and the power splitter 131 is constituted by a lumped constant circuit. Accordingly, it is possible to reduce the circuit size of the power splitter 131.

(Third Modification Example of Power Amplifier Circuit 13)

Figure 14:
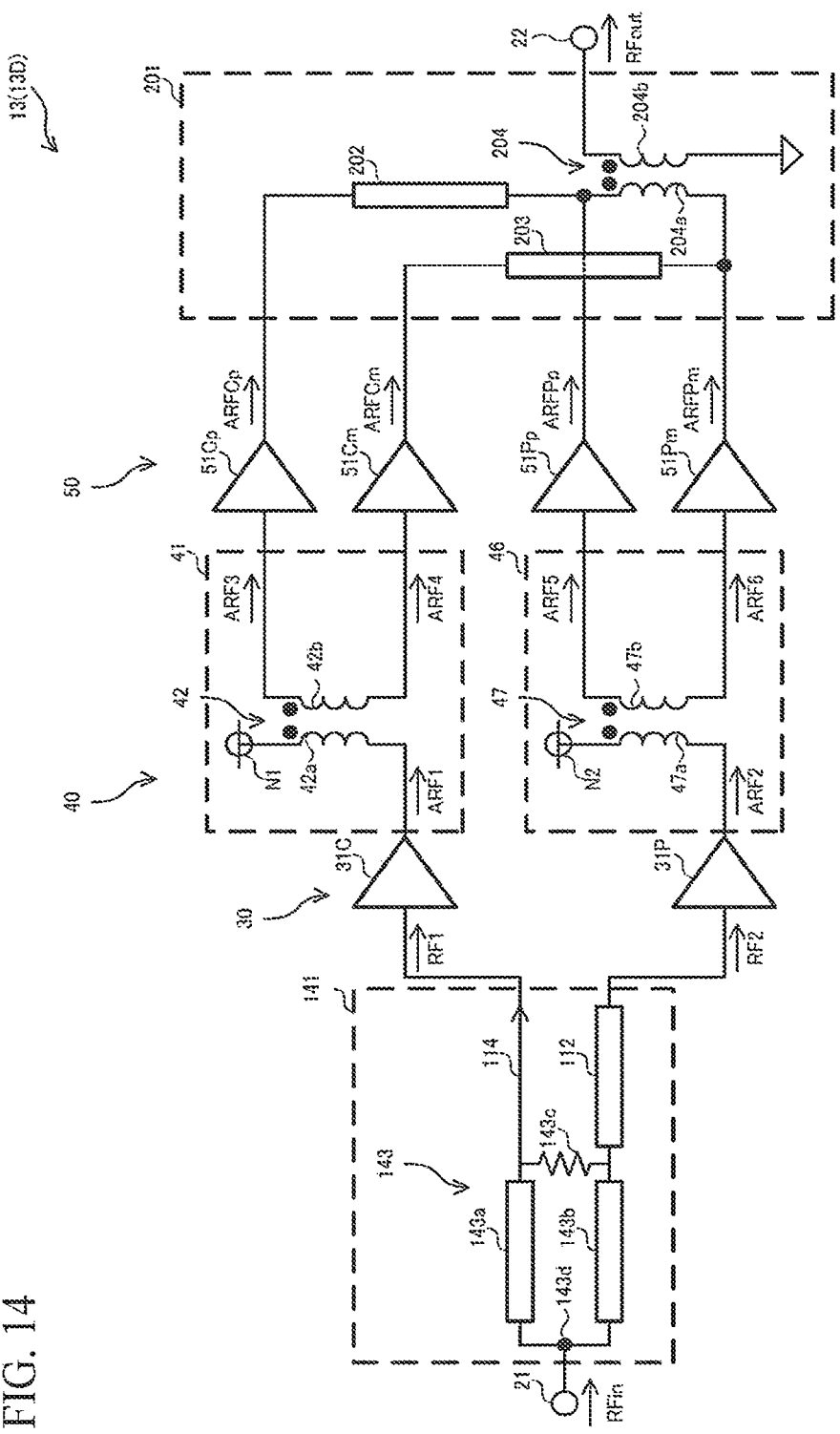
FIG. 14 is a circuit diagram illustrating a third modification example of the power amplifier circuit according to the third embodiment of the present disclosure.

FIG. 14 is a circuit diagram illustrating a third modification example of the power amplifier circuit according to the third embodiment of the present disclosure. As illustrated in FIG. 14, the third modification example of the power amplifier circuit 13 (hereinafter, may be referred to as a power amplifier circuit 13D) is different from the power amplifier circuit 13A illustrated in FIG. 9 in that the input signal RFin is split by a Wilkinson divider 143.

In this modification example, compared with the power amplifier circuit 13A illustrated in FIG. 9, the power amplifier circuit 13D includes a power splitter 141 instead of the power splitter 111.

The power splitter 141 includes the ¼-wavelength line 112, the transmission line 114, and the Wilkinson divider 143. The Wilkinson divider 143 includes ¼-wavelength lines 143a and 143b and a resistor 143c.

The Wilkinson divider 143 branches the input signal RFin supplied from the input terminal 21 through a first end of the power splitter 141 into the signal RF1 and the signal RF2.

More specifically, the ¼-wavelength line 143a in the Wilkinson divider 143 has a first end connected to the first end of the power splitter 141 through a node 143d, and a second end. The ¼-wavelength line 143b has a first end connected to the first end of the power splitter 141 through the node 143d, and a second end. The resistor 143c has a first end connected to the second end of the ¼-wavelength line 143*a*, and a second end connected to the second end of the ¼-wavelength line 143*b*.

The transmission line 114 has a first end connected to the second end of the ¼-wavelength line 143*a*, and a second end connected to the input terminal of the driver-stage amplifier 31C through a third end of the power splitter 141. The ¼-wavelength line 112 has a first end connected to the second end of the ¼-wavelength line 143*b*, and a second end connected to the input terminal of the driver-stage amplifier 31P through a second end of the power splitter 141.

The signal RF1 is supplied to the input terminal of the driver-stage amplifier 31C through the ¼-wavelength line 143*a* and the transmission line 114. The signal RF2 is supplied to the input terminal of the driver-stage amplifier 31P through the ¼-wavelength line 143*b* and the ¼-wavelength line 112.

The signal RF1 that has passed through the ¼-wavelength line 143*a* is approximately aligned in phase with the signal RF2 that has passed through the ¼-wavelength line 143*b*. The signal RF2 that has passed through the ¼-wavelength line 112 is delayed in phase by approximately 90 degrees with respect to the signal RF1 that has passed through the transmission line 114.

Fourth Embodiment

Figure 15:
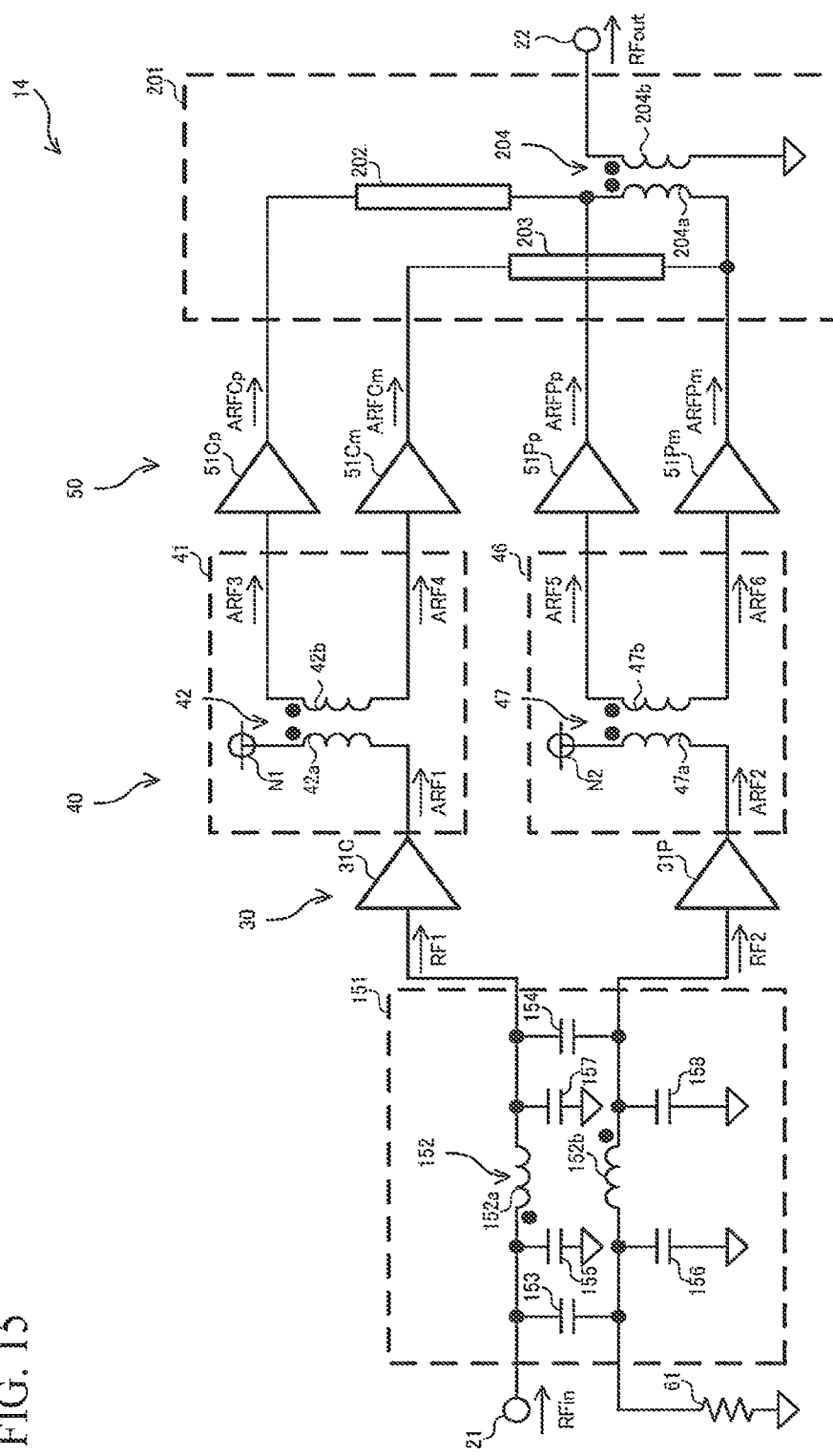
FIG. 15 is a circuit diagram illustrating a power amplifier circuit according to a fourth embodiment of the present disclosure.

A power amplifier circuit according to a fourth embodiment will be described. FIG. 15 is a circuit diagram illustrating the power amplifier circuit according to the fourth embodiment of the present disclosure. As illustrated in FIG. 15, a power amplifier circuit 14 according to the fourth embodiment is different from the power amplifier circuit 11 according to the first embodiment in that the distributed constant circuit in the 90-degree hybrid coupler 101 is replaced with a lumped constant circuit.

In this embodiment, compared with the power amplifier circuit 11A illustrated in FIG. 1, the power amplifier circuit 14 includes a power splitter 151 instead of the 90-degree hybrid coupler 101.

The power splitter 151 has a first end supplied with the input signal RFin through the input terminal 21, a second end connected to the driver-stage amplifier 31C and supplying the signal RF1, a third end grounded through the resistor 61, and a fourth end connected to the driver-stage amplifier 31P and supplying the signal RF2.

More specifically, the power splitter 151 includes a transformer 152 and capacitors 153 (first capacitor), 154 (second capacitor), 155, 156, 157, and 158. The transformer 152 includes a primary-side winding 152*a* (first inductor) and a secondary-side winding 152*b* (second inductor).

The primary-side winding 152*a* in the transformer 152 has a first end connected to the input terminal 21 through the first end of the power splitter 151, and a second end connected to the input terminal of the driver-stage amplifier 31C through the second end of the power splitter 151. The secondary-side winding 152*b* is electromagnetically coupled to the primary-side winding 152*a* and has a first end grounded through the third end of the power splitter 151 and the resistor 61, and a second end connected to the input terminal of the driver-stage amplifier 31P through the fourth end of the power splitter 151.

The capacitor 153 has a first end connected to the first end of the primary-side winding 152*a*, and a second end connected to the first end of the secondary-side winding 152*b*. The capacitor 155 has a first end connected to the first end of the primary-side winding 152*a*, and a second end that is grounded. The capacitor 156 has a first end connected to the first end of the secondary-side winding 152*b*, and a second end that is grounded.

The capacitor 157 has a first end connected to the second end of the primary-side winding 152*a*, and a second end that is grounded. The capacitor 158 has a first end connected to the second end of the secondary-side winding 152*b*, and a second end that is grounded. The capacitor 154 has a first end connected to the second end of the primary-side winding 152*a*, and a second end connected to the second end of the secondary-side winding 152*b*.

In the power amplifier circuit 14, instead of the 90-degree hybrid coupler 101 (see FIG. 1) including the transmission lines 101*a* and 101*b* represented by the distributed constant circuit, the power splitter 151 is constituted by the lumped constant circuit. Accordingly, it is possible to reduce the circuit size of the power splitter 151 while performing favorable power splitting.

In addition, in the power amplifier circuit 14, even if the balun input impedance varies and a reflected wave from the carrier-side balun 41 or the peak-side balun 46 to the power splitter 151 is generated, it is possible to suppress the reflected wave by the driver-stage amplifier circuit 30 having good isolation characteristics.

Accordingly, even if the power splitter 151 is used, it is possible to suppress variations in the performance of the power amplifier circuit 14 among individual products and provide the power amplifier circuit 14 with stable performance.

Fifth Embodiment

Figure 16:
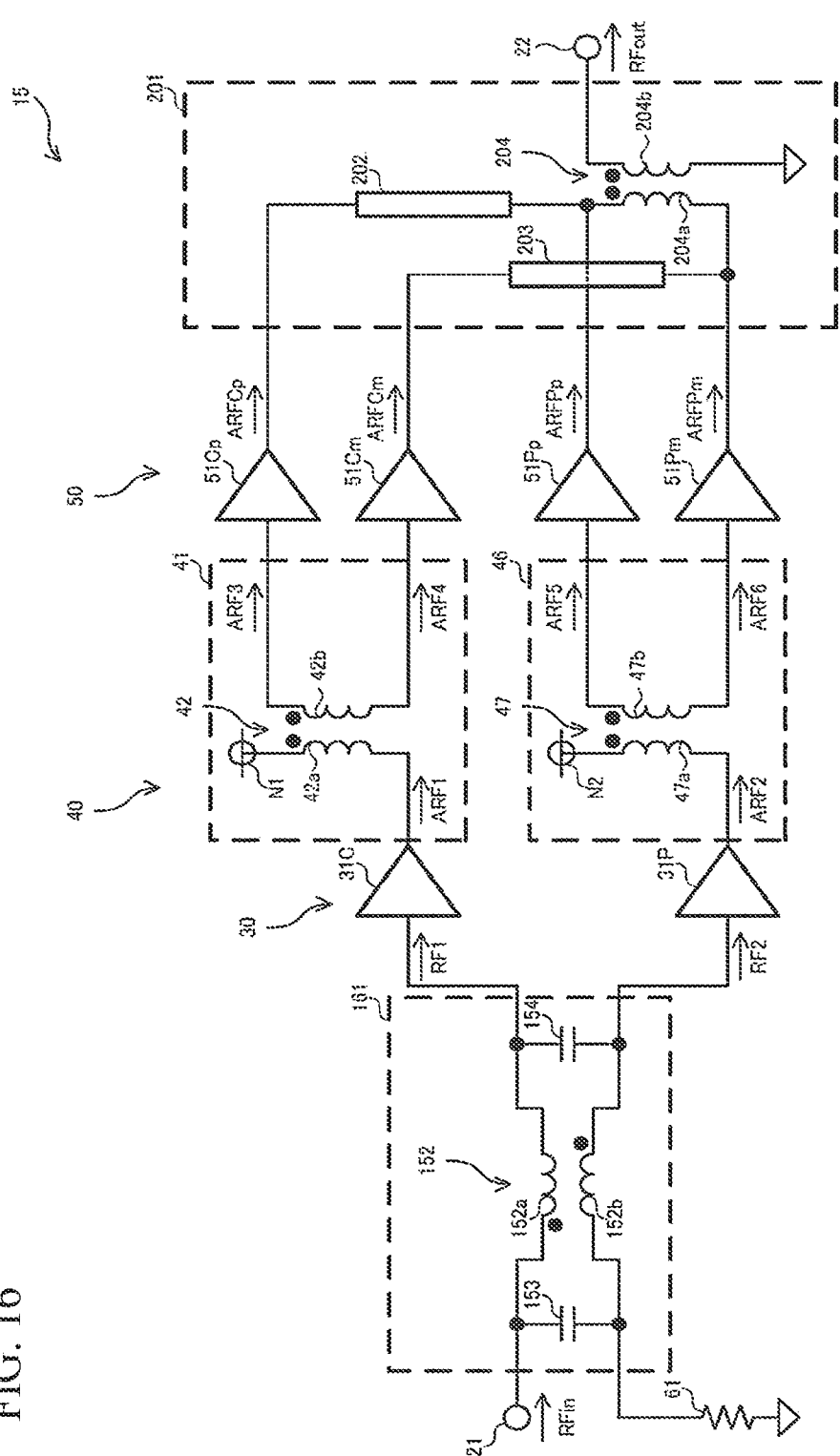
FIG. 16 is a circuit diagram illustrating a power amplifier circuit according to a fifth embodiment of the present disclosure.

A power amplifier circuit according to a fifth embodiment will be described. FIG. 16 is a circuit diagram illustrating the power amplifier circuit according to the fifth embodiment of the present disclosure. As illustrated in FIG. 16, a power amplifier circuit 15 according to the fifth embodiment is different from the power amplifier circuit 14 according to the fourth embodiment in that the power splitter is not grounded through a capacitor.

In this embodiment, compared with the power amplifier circuit 14 illustrated in FIG. 15, the power amplifier circuit 15 includes a power splitter 161 instead of the power splitter 151.

The power splitter 161 has a first end supplied with the input signal RFin through the input terminal 21, a second end connected to the driver-stage amplifier 31C and supplying the signal RF1, a third end grounded through the resistor 61, and a fourth end connected to the driver-stage amplifier 31P and supplying the signal RF2.

More specifically, the power splitter 161 includes the transformer 152 and the capacitors 153 and 154. The primary-side winding 152*a* in the transformer 152 has a first end connected to the input terminal 21 through the first end of the power splitter 161, and a second end connected to the input terminal of the driver-stage amplifier 31C through the second end of the power splitter 161. The secondary-side winding 152*b* has a first end grounded through the third end of the power splitter 161 and the resistor 61, and a second end connected to the input terminal of the driver-stage amplifier 31P through the fourth end of the power splitter 161.

The capacitor 153 has a first end connected to the first end of the primary-side winding 152*a*, and a second end connected to the first end of the secondary-side winding 152*b*. The capacitor 154 has a first end connected to the second end of the primary-side winding 152a, and a second end connected to the second end of the secondary-side winding 152b.

Figure 17:
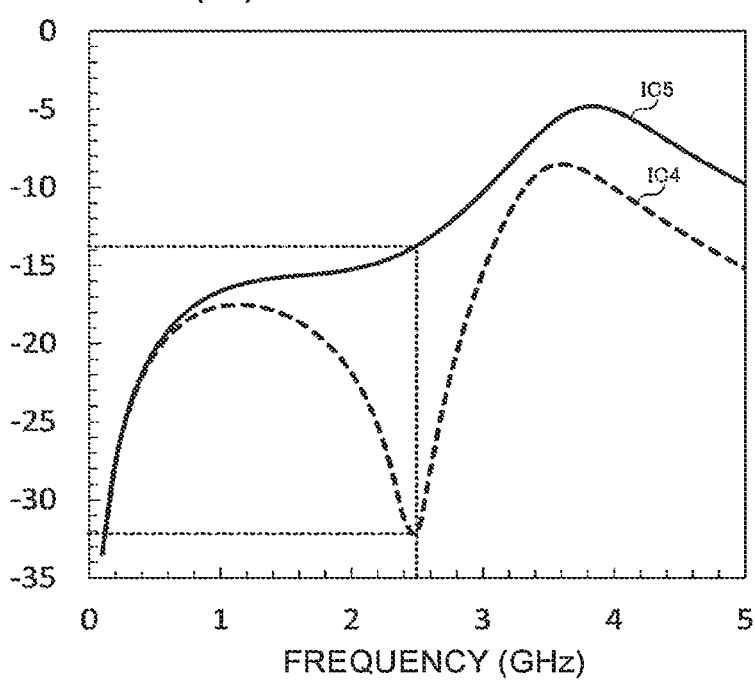
FIG. 17 is a graph illustrating an example of a frequency change of a dielectric isolation capability of a power splitter according to the fifth embodiment of the present disclosure.

FIG. 17 is a graph illustrating an example of a frequency change of a dielectric isolation capability of the power splitter according to the fifth embodiment of the present disclosure. In FIG. 17, the horizontal axis represents frequency in the unit of "GHz", and the vertical axis represents dielectric isolation (isolation) capability in the unit of "dB".

The dielectric isolation capability is expressed in the unit of dB as a ratio of the reflection of the driver-stage amplifier 31C, to which the reflected wave generated by the reflection in the carrier-side balun 41 is added, to the input to the driver-stage amplifier 31P.

As illustrated in FIG. 17, a curve IC5 represents a frequency change of the dielectric isolation capability of the power amplifier circuit 15 (see FIG. 16) when the power splitter 161 is designed to optimize the dielectric isolation capability at a frequency of 2.5 GHz.

A curve IC4 represents a frequency change of the dielectric isolation capability of the power amplifier circuit 14 (see FIG. 15) when the power splitter 151 is designed to optimize the dielectric isolation capability at a frequency of 2.5 GHz.

Since the curve IC4 indicates a dielectric isolation capability of about minus 32 dB at 2.5 GHz, the power splitter 151 in the power amplifier circuit 14 sufficiently suppresses the reflected wave supplied from the driver-stage amplifier 31C to the driver-stage amplifier 31P through the power splitter 151.

On the other hand, since the curve IC5 indicates a dielectric isolation capability of about minus 14 dB at 2.5 GHz, the suppression of the reflected wave supplied from the driver-stage amplifier 31C to the driver-stage amplifier 31P through the power splitter 161 is not sufficient in the power amplifier circuit 15.

For example, when the capacitors 155, 156, 157, and 158 are removed one by one from the power splitter 151 (see FIG. 15) in the power amplifier circuit 14, the dielectric isolation capability deteriorates each time the capacitor is removed.

As described above, even if the power splitter 161 not having a good dielectric isolation capability is used, the reflected wave from the carrier-side balun 41 or the peak-side balun 46 to the power splitter 161 can be suppressed by the driver-stage amplifier circuit 30 having good isolation characteristics. Accordingly, it is possible to suppress variations in the performance of the power amplifier circuit 15 among individual products and provide the power amplifier circuit 15 having stable performance.

Sixth Embodiment

Figure 18:
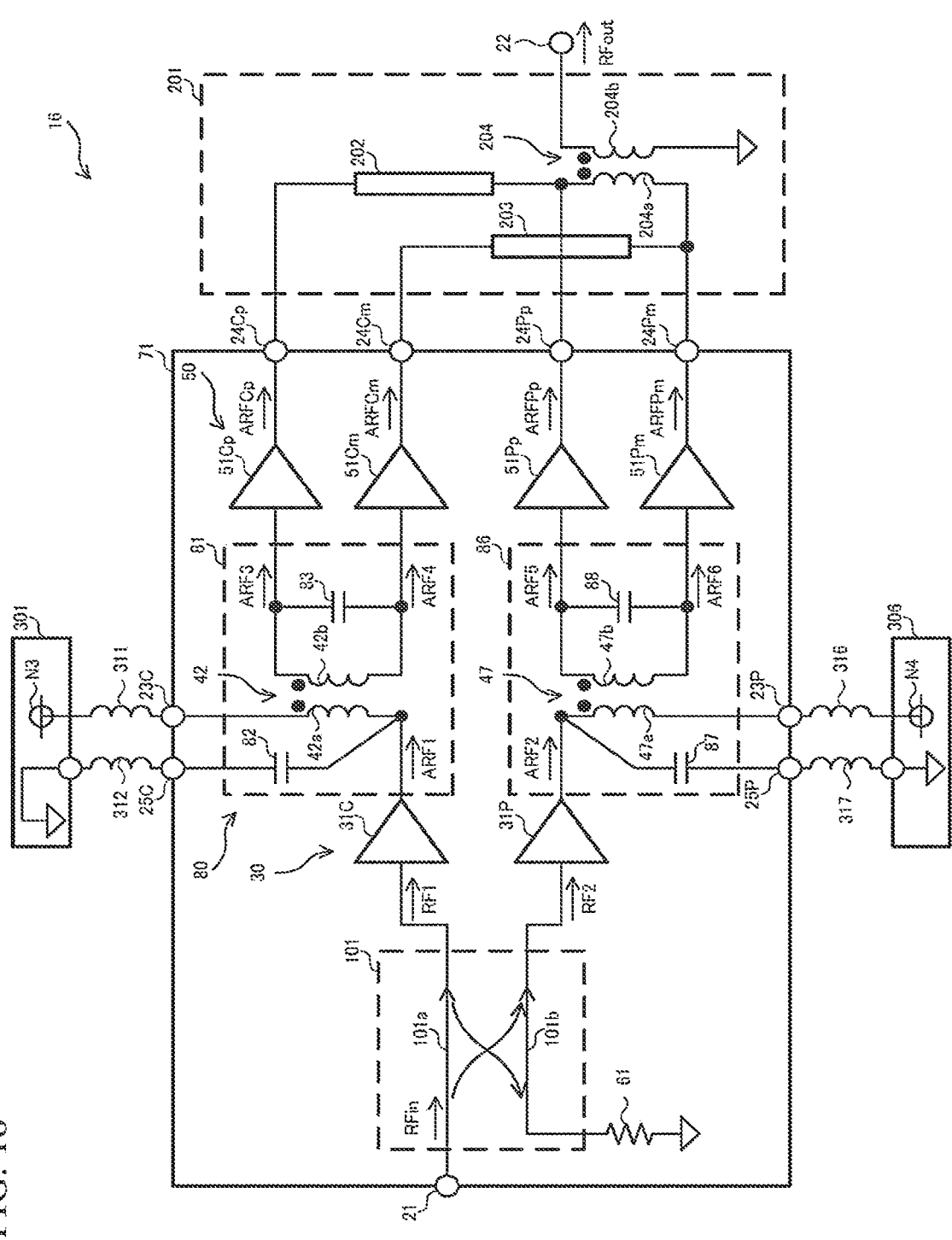
FIG. 18 is a circuit diagram illustrating a power amplifier circuit according to a sixth embodiment of the present disclosure.

A power amplifier circuit according to a sixth embodiment will be described. FIG. 18 is a circuit diagram illustrating the power amplifier circuit according to the sixth embodiment of the present disclosure. As illustrated in FIG. 18, a power amplifier circuit 16 according to the sixth embodiment is different from the power amplifier circuit 12 according to the second embodiment in that a balun is grounded in an external circuit through a capacitor.

In this embodiment, compared with the power amplifier circuit 12 illustrated in FIG. 8, the power amplifier circuit 16 includes a balun circuit 80 instead of the balun circuit 40.

The 90-degree hybrid coupler 101, the driver-stage amplifier circuit 30, the balun circuit 80, and the power-stage amplifier circuit 50 in the power amplifier circuit 16 are provided inside the semiconductor region 71. The power combiner 201 is provided outside the semiconductor region 71. Connection terminals 25C and 25P are terminals provided inside the semiconductor region 71.

The balun circuit 80 includes a carrier-side balun 81 and a peak-side balun 86. The carrier-side balun 81 includes the transformer 42 and capacitors 82 (third capacitor), and 83. The peak-side balun 86 includes the transformer 47 and capacitors 87 (fourth capacitor), and 88.

In the transformer 42 in the carrier-side balun 81, the primary-side winding 42a has a first end connected to the connection terminal 23C, and a second end connected to the output terminal of the driver-stage amplifier 31C and supplied with the amplified signal ARF1. The secondary-side winding 42b has a first end connected to the output terminal of the carrier amplifier 51Cp to supply the amplified signal ARF3, and a second end connected to the output terminal of the carrier amplifier 51Cm to supply the amplified signal ARF4.

The capacitor 83 has a first end connected to the first end of the secondary-side winding 42b, and a second end connected to the second end of the secondary-side winding 42b.

In the carrier-side balun 81, the second end of the primary-side winding 42a is connected to the external circuit 301 through the capacitor 82. In this embodiment, the capacitor 82 has a first end connected to the second end of the primary-side winding 42a, and a second end connected to the connection terminal 25C. The connection terminal 25C is grounded in the external circuit 301 through, for example, a wire or microbump in which an inductor component is parasitic. That is, the connection terminal 25C is grounded in the external circuit 301 through a parasitic inductor 312 of the wire or microbump.

The connection terminal 23C is connected to a power source voltage supplying node N3 in the external circuit 301 through the wire or microbump in which an inductor component is parasitic. That is, the connection terminal 23C is connected to the power source voltage supplying node N3 in the external circuit 301 through the parasitic inductor 311 of the wire or microbump.

In the transformer 47 in the peak-side balun 86, the primary-side winding 47a has a first end connected to the connection terminal 23P, and a second end connected to the output terminal of the driver-stage amplifier 31P and supplied with the amplified signal ARF2. The secondary-side winding 47b has a first end connected to the output terminal of the peak amplifier 51Pp to supply the amplified signal ARF5, and a second end connected to the output terminal of the peak amplifier 51Pm to supply the amplified signal ARF6.

The capacitor 88 has a first end connected to the first end of the secondary-side winding 47b, and a second end connected to the second end of the secondary-side winding 47b.

In the peak-side balun 86, the second end of the primary-side winding 47a is connected to the external circuit 306 through the capacitor 87. In this embodiment, the capacitor 87 has a first end connected to the second end of the primary-side winding 47a, and a second end connected to the connection terminal 25P. The connection terminal 25P is grounded in the external circuit 306 through, for example, a wire or microbump in which an inductor component is parasitic. That is, the connection terminal 25P is grounded in the external circuit 306 through a parasitic inductor 317 of the wire or microbump.

The connection terminal 23P is connected to a power source voltage supplying node N4 in the external circuit 306 through the wire or microbump in which an inductor component is parasitic. That is, the connection terminal 23P is connected to the power source voltage supplying node N4 in the external circuit 306 through the parasitic inductor 316 of the wire or microbump.

In the carrier-side balun 81, a resonant circuit is often formed by the inductance of the primary-side winding 42a, the inductance of the parasitic inductor 311, the inductance of the parasitic inductor 312, the capacitance of the capacitor 82, and other parasitic capacitances. If the inductance of the parasitic inductor 311 and the inductance of the parasitic inductor 312 vary due to manufacturing errors, the resonant frequency of the resonant circuit varies, and the reflected wave by the carrier-side balun 81 increases.

Likewise, in the peak-side balun 86, a resonant circuit is often formed by the inductance of the primary-side winding 47a, the inductance of the parasitic inductor 316, the inductance of the parasitic inductor 317, the capacitance of the capacitor 87, and other parasitic capacitances. If the inductance of the parasitic inductor 316 and the inductance of the parasitic inductor 317 vary due to manufacturing errors, the resonant frequency of the resonant circuit varies, and the reflected wave by the peak-side balun 86 increases.

In contrast, in the power amplifier circuit 16, the reflected wave from the balun circuit 80 can be suppressed by the driver-stage amplifier circuit 30 having good isolation characteristics. As a result, the resonant frequency of the resonant circuit in the carrier-side balun 81 or the peak-side balun 86 varies greatly, and it is possible to suppress a decrease in the performance of the power amplifier circuit 16 even in an individual product of the power amplifier circuit 16 having a large reflected wave. Accordingly, even if variations in the resonant frequency of the resonant circuit are large among individual products, it is possible to suppress variations in the performance of the power amplifier circuit 16 among individual products and provide the power amplifier circuit 16 with stable performance.

In the power amplifier circuit 16 according to this embodiment, the carrier-side balun 81 is connected to the external circuit 301 through the parasitic inductors 311 and 312 provided in parallel, and the peak-side balun 86 is connected to the external circuit 306 through the parasitic inductors 316 and 317 provided in parallel. Although such a configuration has been described, the configuration is not limited to this. A configuration may be employed in which the peak-side balun 86 is not connected to the external circuit 306 through the parasitic inductors 316 and 317, but the carrier-side balun 81 is connected to the external circuit 301 through one of the parasitic inductors 311 and 312. A configuration may also be employed in which the carrier-side balun 81 is not connected to the external circuit 301 through the parasitic inductors 311 and 312, but the peak-side balun 86 is connected to the external circuit 306 through one of the parasitic inductors 316 and 317.

In the power amplifier circuit 16 according to this embodiment, the 90-degree hybrid coupler 101, the driver-stage amplifier circuit 30, the balun circuit 80, and the power-stage amplifier circuit 50 are provided inside the semiconductor region 71. Although such a configuration has been described, the configuration is not limited to this. Only the driver-stage amplifier circuit 30 and the balun circuit 80 may be provided inside the semiconductor region 71.

The exemplary embodiments of the present disclosure have been described above. In the power amplifier circuits 11, 12, 13, 14, 15, and 16, the power splitter splits the input signal RFin to the signal RF1 and the signal RF2 having a different phase from the signal RF1. The driver-stage amplifier 31C amplifies the signal RF1 and outputs the amplified signal ARF1. The driver-stage amplifier 31P amplifies the signal RF2 and outputs the amplified signal ARF2. The carrier-side balun 41 splits the amplified signal ARF1 into the amplified signal ARF3 and the amplified signal ARF4 having a different phase from the amplified signal ARF3. The carrier amplifiers 51Cp and 51Cm amplify the amplified signals ARF3 and ARF4, respectively. The peak-side balun 46 splits the amplified signal ARF2 into the amplified signal ARF5 and the amplified signal ARF6 having a different phase from the amplified signal ARF5. The peak amplifier 51Pp amplifies the amplified signal ARF5 if the power level of the amplified signal ARF5 is equal to or higher than the predetermined power level. The peak amplifier 51Pm amplifies the amplified signal ARF6 if the power level of the amplified signal ARF6 is equal to or higher than the predetermined power level.

For example, even in an individual product in which a reflected wave of the amplified signal ARF1 is generated in the carrier-side balun 41 due to variations in the input impedance at the time of mass production, the reflected wave to propagate to the power splitter can be suppressed by the driver-stage amplifier 31C having good isolation characteristics. In addition, for example, even in an individual product in which a reflected wave of the amplified signal ARF2 is generated in the peak-side balun 46 due to variations in the input impedance at the time of mass production, the reflected wave to propagate to the power splitter can be suppressed by the driver-stage amplifier 31P having good isolation characteristics. Accordingly, it is possible to suppress propagation of the reflected wave to a circuit in a preceding stage of the power splitter through the power splitter or to the other driver-stage amplifier. Accordingly, it is possible to provide the power amplifier circuits 11, 12, 13, 14, 15, and 16 suitable for mass production by suppressing adverse effects on the power split ratio and the split phase of the power splitter and hence on distortion characteristics of the circuit in the preceding stage. Accordingly, it is possible to provide a power amplifier circuit suitable for mass production in a configuration in which signals split by a balun are differentially amplified.

In addition, the 90-degree hybrid coupler 101, the driver-stage amplifier circuit 30, the balun circuit 40, and the power-stage amplifier circuit 50 in the power amplifier circuit 12 are provided inside the semiconductor region 71 of a single semiconductor substrate. The carrier-side balun 41 includes a terminal connected to the external circuit 301. The peak-side balun 46 includes a terminal connected to the external circuit 306.

The external circuit 301 provided outside the semiconductor region 71 and the carrier-side balun 41 are connected to each other, and the external circuit 306 provided outside the semiconductor region 71 and the peak-side balun 46 are connected to each other, for example, through a wire or microbump in which an inductor component is parasitic.

Due to variations in the wire and microbump among individual products at the time of mass production, the inductance of the parasitic inductors 311 and 316 also varies among individual products, which increases variations in the input impedance of the carrier-side balun 41 and the input impedance of the peak-side balun 46. In contrast, in the power amplifier circuit 12, the reflected wave from the balun circuit 40 can be suppressed by the driver-stage amplifier circuit 30 having good isolation characteristics. Accordingly, even in an individual product of the power amplifier circuit 12 in which the input impedance of the carrier-side balun 41 or the peak-side balun 46 varies greatly and the reflected wave is large, it is possible to suppress a decrease in the performance of the power amplifier circuit 12. In addition, since the power amplifier circuit 12 is a circuit in which a decrease in performance due to manufacturing errors is suppressed, it is possible to widen a design range in which the power amplifier circuit 12 having stable and good performance can be implemented. That is, the power amplifier circuit 12 can be easily designed.

In addition, in the power amplifier circuit 13, the power splitters 111, 121, 131, and 141 do not include a terminal grounded through a resistor.

The reflected wave from the balun circuit 40 can be suppressed by the driver-stage amplifier circuit 30 having good isolation characteristics. Accordingly, even if the power splitters 111, 121, 131, and 141 not having good isolation characteristics because a resistor for attenuating the reflected wave is not connected are used, it is possible to suppress variations in the performance of the power amplifier circuit 13 among individual products and provide the power amplifier circuit 13 having stable performance. In addition, even if the power splitter does not have good isolation characteristics, since the power amplifier circuit 13 is a circuit in which a decrease in performance due to manufacturing errors is suppressed, it is possible to widen a design range in which the power amplifier circuit 13 having stable and good performance can be implemented. That is, the power amplifier circuit 13 can be easily designed. In addition, since no resistor is connected to the power splitters 111, 121, 131, and 141, the configuration of the power amplifier circuit 13 can be simplified.

In addition, in the power amplifier circuits 11, 12, 14, 15, and 16, the power splitter includes a terminal grounded through the resistor 61.

As described above, the isolation characteristic of the power splitter can be improved by the configuration in which the power splitter includes a terminal grounded through the resistor 61 for attenuating the reflected wave. Accordingly, it is possible to effectively suppress the reflected wave from the balun circuit 40 from propagating to the circuit in the preceding stage of the power splitter through the power splitter or propagating to the other driver-stage amplifier.

In the power amplifier circuit 15, in the power splitter 161, the primary-side winding 152a of the transformer 152 has a first end to which the input signal RFin is supplied, and a second end to which the signal RF1 is supplied. The secondary-side winding 152b is electromagnetically coupled to the primary-side winding 152a, and has a first end that is grounded through the resistor 61, and a second end that supplies the signal RF2. The capacitor 153 has a first end connected to the first end of the primary-side winding 152a, and a second end connected to the first end of the secondary-side winding 152b. The capacitor 154 has a first end connected to the second end of the primary-side winding 152a, and a second end connected to the second end of the secondary-side winding 152b.

As described above, the power splitter 161 is constituted by a lumped constant circuit. Accordingly, it is possible to reduce the circuit size of the power splitter 161 while performing favorable power splitting. In addition, although the dielectric isolation capability of the power splitter 161 is poor as compared with the power splitter 151, even if the balun input impedance varies and a reflected wave from the carrier-side balun 41 or the peak-side balun 46 to the power splitter 161 is generated, it is possible to suppress the reflected wave by the driver-stage amplifier circuit 30 having good isolation characteristics. Accordingly, even if the power splitter 161 having a simple configuration but poor dielectric isolation capability as compared with the power splitter 151 is used, it is possible to suppress variations in the performance of the power amplifier circuit 15 among individual products and provide the power amplifier circuit 15 with stable performance. In addition, even if the dielectric isolation capability of the power splitter 161 is poor as compared with the power splitter 151, since the power amplifier circuit 15 is a circuit in which a decrease in performance due to manufacturing errors is suppressed, it is possible to widen a design range in which the power amplifier circuit 15 having stable and good performance can be implemented. That is, the power amplifier circuit 15 can be easily designed. In addition, by adding at least one of the capacitors 155, 156, 157, and 158 to the power splitter 161, it is possible to increase the dielectric isolation capability of the power splitter 161. Accordingly, it is possible to effectively suppress variations in the performance of the power amplifier circuit 15 among individual products.

In the power amplifier circuit 16, the carrier-side balun 81 is formed inside the semiconductor region 71 and includes the capacitor 82. The carrier-side balun 81 is connected to the output terminal of the driver-stage amplifier 31C and includes a terminal connected to the external circuit 301 through the capacitor 82.

The external circuit 301 provided outside the semiconductor region 71 and the capacitor 82 are connected to each other, for example, through a wire or microbump in which an inductor component is parasitic. Due to variations in the wire and microbump among individual products at the time of mass production, the inductance of the parasitic inductor 312 also varies among individual products, which increases variations in the input impedance of the carrier-side balun 81. In contrast, in the power amplifier circuit 16, the reflected wave from the balun circuit 80 can be suppressed by the driver-stage amplifier circuit 30 having good isolation characteristics. Accordingly, even in an individual product of the power amplifier circuit 16 in which the input impedance of the carrier-side balun 81 varies greatly and the reflected wave is large, it is possible to suppress a decrease in the performance of the power amplifier circuit 16. In addition, since the power amplifier circuit 16 is a circuit in which a decrease in performance due to manufacturing errors is suppressed, it is possible to widen a design range in which the power amplifier circuit 16 having stable and good performance can be implemented. That is, the power amplifier circuit 16 can be easily designed.

In addition, in the power amplifier circuit 16, the peak-side balun 86 is formed inside the semiconductor region 71 and includes the capacitor 87. The peak-side balun 86 is connected to the output terminal of the driver-stage amplifier 31P and includes a terminal connected to the external circuit 306 through the capacitor 87.

The external circuit 306 provided outside the semiconductor region 71 and the capacitor 87 are connected to each other, for example, through a wire or microbump in which an inductor component is parasitic. Due to variations in the wire and microbump among individual products at the time of mass production, the inductance of the parasitic inductor 317 also varies among individual products, which increases variations in the input impedance of the peak-side balun 86. In contrast, in the power amplifier circuit 16, the reflected wave from the balun circuit 80 can be suppressed by the driver-stage amplifier circuit 30 having good isolation characteristics. Accordingly, even in an individual product of the power amplifier circuit 16 in which the input impedance of the peak-side balun 86 varies greatly and the reflected wave is large, it is possible to suppress a decrease in the performance of the power amplifier circuit 16. In addition, since the power amplifier circuit 16 is a circuit in which a decrease in performance due to manufacturing errors is suppressed, it is possible to widen a design range in which the power amplifier circuit 16 having stable and good performance can be implemented. That is, the power amplifier circuit 16 can be easily designed.

It should be noted that the embodiments described above are intended to facilitate understanding of the present disclosure, and are not intended to limit the present disclosure. The present disclosure can be modified/improved without necessarily departing from the gist thereof, and equivalents thereof are also included in the present disclosure. That is, those skilled in the art can modify the design of each embodiment as appropriate, and such modifications are also included in the scope of the present disclosure as long as they have the features of the present disclosure. For example, each element included in each embodiment and the arrangement, material, condition, shape, size, and the like thereof are not limited to those illustrated, and can be changed as appropriate. Each embodiment is an example, and it is needless to say that the configurations illustrated in different embodiments can be partly replaced or combined. These are also included in the scope of the present disclosure as long as they include the features of the present disclosure.

REFERENCE SIGNS LIST

11, 12, 13, 14, 15, 16 power amplifier circuit
21 input terminal
22 output terminal
23C, 23P, 25C, 25P connection terminal
30 driver-stage amplifier circuit
31C, 31P driver-stage amplifier
40 balun circuit
41 carrier-side balun
42 transformer
46 peak-side balun
47 transformer
50 power-stage amplifier circuit
51Cp, 51Cm carrier amplifier
51Pp, 51Pm peak amplifier
61 resistor
71 semiconductor region
80 balun circuit
81 carrier-side balun
86 peak-side balun
101 90-degree hybrid coupler
111, 121, 131, 141, 151, 161 power splitter
143 Wilkinson divider
201, 211, 221, 231, 241 power combiner
301, 306 external circuit
311, 312, 316, 317 parasitic inductor

The invention claimed is:

1. A power amplifier circuit comprising:
a power splitter configured to split an input signal into a first signal and a second signal having a different phase from the first signal;
a first amplifier configured to amplify the first signal and to output a first amplified signal;
a second amplifier configured to amplify the second signal and to output a second amplified signal;
a first balun configured to split the first amplified signal into a third amplified signal and a fourth amplified signal having a different phase from the third amplified signal;
a third amplifier configured to amplify the third amplified signal;

a fourth amplifier configured to amplify the fourth amplified signal;
a second balun configured to split the second amplified signal into a fifth amplified signal and a sixth amplified signal having a different phase from the fifth amplified signal;
a fifth amplifier configured to amplify the fifth amplified signal when a power level of the fifth amplified signal is equal to or greater than a first predetermined power level; and
a sixth amplifier configured to amplify the sixth amplified signal when a power level of the sixth amplified signal is equal to or greater than a second predetermined power level.

2. The power amplifier circuit according to claim 1,
wherein the power amplifier circuit is on a single semiconductor substrate, and
wherein the first balun or the second balun comprises a terminal configured to externally connect the semiconductor substrate.

3. The power amplifier circuit according to claim 1,
wherein the power splitter does not comprise a terminal grounded through a resistor.

4. The power amplifier circuit according to claim 1,
wherein the power splitter comprises a terminal grounded through a resistor.

5. The power amplifier circuit according to claim 4,
wherein the power splitter comprises:
a first inductor having a first end to which the input signal is supplied and a second end that supplies the first signal;
a second inductor electromagnetically coupled to the first inductor and having a first end that is the terminal, and a second end that supplies the second signal;
a first capacitor having a first end connected to the first end of the first inductor, and a second end connected to the first end of the second inductor; and
a second capacitor having a first end connected to the second end of the first inductor, and a second end connected to the second end of the second inductor.

6. The power amplifier circuit according to claim 1,
wherein the first balun is on a semiconductor substrate and comprises a third capacitor, and
wherein the first balun is connected to an output terminal of the first amplifier and comprises a terminal configured to externally connect the semiconductor substrate through the third capacitor.

7. The power amplifier circuit according to claim 1,
wherein the second balun is on a semiconductor substrate and comprises a fourth capacitor, and
wherein the second balun is connected to an output terminal of the second amplifier and comprises a terminal configured to externally connect the semiconductor substrate through the fourth capacitor.

8. The power amplifier circuit according to claim 1, further comprising:
a power combiner configured to combine amplified signals respectively output from the third amplifier, the fourth amplifier, the fifth amplifier, and the sixth amplifier,
wherein a first part of the power combiner comprises a semiconductor substrate, and second part of the power combiner comprises a module substrate.

9. The power amplifier circuit according to claim 8,
wherein a part of the power combiner comprises a lumped constant circuit element, and wherein at least a part of the lumped constant circuit element is a surface mount device mounted on the module substrate.

\* \* \* \* \*